US012573445B2

(12) United States Patent
Jung et al.

(10) Patent No.: US 12,573,445 B2
(45) Date of Patent: Mar. 10, 2026

(54) MEMORY DEVICE

(71) Applicant: Samsung Electronics Co., Ltd.,
Suwon-si (KR)

(72) Inventors: Sang-Hoon Jung, Suwon-si (KR);
Jeong Don Ihm, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 111 days.

(21) Appl. No.: 18/670,780

(22) Filed: May 22, 2024

(65) Prior Publication Data

US 2025/0191644 A1 Jun. 12, 2025

(30) Foreign Application Priority Data

Dec. 8, 2023 (KR) ........................ 10-2023-0177405

(51) Int. Cl.
| | |
|---|---|
| *G11C 11/408* | (2006.01) |
| *G11C 5/06* | (2006.01) |
| *G11C 11/4091* | (2006.01) |
| *H01L 23/00* | (2006.01) |
| *H10B 12/00* | (2023.01) |

(52) U.S. Cl.
CPC .......... *G11C 11/4085* (2013.01); *G11C 5/063*
(2013.01); *G11C 11/4091* (2013.01); *H01L*
*24/08* (2013.01); *H10B 12/315* (2023.02);
*H10B 12/482* (2023.02); *H10B 12/488*
(2023.02); *H01L 2224/08145* (2013.01)

(58) Field of Classification Search
CPC . G11C 11/4085; G11C 5/063; G11C 11/4091;
G11C 5/025; G11C 11/4097; G11C
11/4094; H01L 24/08; H01L 2224/08145;
H01L 24/80; H01L 25/0657; H01L
23/535; H01L 25/18; H01L 2225/06527;
H10B 12/50; H10B 12/312; H10B 12/03;
H10B 12/09; H10B 80/00; H10B 12/315;
H10B 12/482; H10B 12/488
USPC ........................................ 365/185.23, 185.24
See application file for complete search history.

(56) References Cited

U.S. PATENT DOCUMENTS

| | | | | |
|---|---|---|---|---|
| 5,504,439 A | * | 4/1996 | Tavana .................. | H01L 23/528 |
| | | | | 326/38 |
| 5,870,408 A | * | 2/1999 | Aggarwal ...... | G01R 31/318505 |
| | | | | 714/724 |
| 10,600,772 B2 | | 3/2020 | Sukekawa | |
| 10,998,316 B2 | | 5/2021 | Lee | |

(Continued)

*Primary Examiner* — Michael T Tran
(74) *Attorney, Agent, or Firm* — Wolf, Greenfield &
Sacks, P.C.

(57) ABSTRACT

A memory device comprises a cell chip including a memory
cell array having a plurality of first lines and a plurality of
second lines, first and second bonding pads adjacent to each
other in a first region and electrically connected to the
plurality of first lines, and third and fourth bonding pads
adjacent to each other in a second region different from the
first region and electrically connected to the plurality of
second lines, and a logic chip electrically connected to the
first, second, third, and fourth bonding pads of the cell chip.
The first and second bonding pads are electrically connected
to a third line among the plurality of first lines, and the third
and fourth bonding pads are electrically connected to fourth
and fifth lines among the plurality of second lines, respec-
tively.

20 Claims, 18 Drawing Sheets

(56)  References Cited

U.S. PATENT DOCUMENTS

| | | | |
|---|---|---|---|
| 11,721,668 B2 | 8/2023 | Liu et al. | |
| 2002/0195625 A1* | 12/2002 | Hasegawa | H01L 23/5258 |
| | | | 257/209 |
| 2005/0122306 A1* | 6/2005 | Wilcox | G02F 1/155 |
| | | | 345/107 |
| 2005/0156616 A1* | 7/2005 | Morishita | G11C 29/1201 |
| | | | 324/754.03 |
| 2005/0212141 A1* | 9/2005 | Anzai | H01L 24/05 |
| | | | 257/773 |
| 2006/0043425 A1* | 3/2006 | Sakurai | H01L 23/5286 |
| | | | 257/E23.153 |
| 2006/0214798 A1* | 9/2006 | Wang | G06K 19/0723 |
| | | | 340/572.1 |
| 2011/0272788 A1* | 11/2011 | Kim | H01L 25/50 |
| | | | 257/E29.026 |
| 2012/0163811 A1* | 6/2012 | Doany | G02B 6/43 |
| | | | 250/208.2 |
| 2013/0091312 A1* | 4/2013 | Ken | G11C 5/06 |
| | | | 710/106 |
| 2019/0295986 A1* | 9/2019 | Oh | H01L 24/13 |
| 2022/0108985 A1* | 4/2022 | Nagatsuka | H10D 86/423 |
| 2022/0216239 A1 | 7/2022 | Yoo et al. | |
| 2022/0342165 A1* | 10/2022 | Wilkerson | G02B 6/425 |
| 2022/0344368 A1* | 10/2022 | Kang | H10B 43/27 |
| 2023/0060149 A1 | 3/2023 | Zhu et al. | |
| 2023/0133520 A1 | 5/2023 | Zhao et al. | |
| 2023/0207454 A1 | 6/2023 | Parekh | |
| 2023/0260969 A1 | 8/2023 | Quader et al. | |

* cited by examiner

10

X1-X1'

Y1-Y1'

<u>100</u>

175 — BLSA

165 — SWD

175 — BLSA

Y

Z X

MEMORY DEVICE

CROSS-REFERENCE TO RELATED APPLICATION

This application claims priority from Korean Patent Application No. 10-2023-0177405 filed on Dec. 8, 2023, in the Korean Intellectual Property Office and all the benefits accruing therefrom under 35 U.S.C. 119, the contents of which in its entirety are herein incorporated by reference.

FIELD

The present disclosure relates to a memory device.

BACKGROUND

A dynamic random access memory device (DRAM) with a cell-on-peri (CoP) structure may bond an upper wafer including memory cells to a lower wafer including peripheral logic in a hybrid Copper Bonding (HCB) method. A word line and a bit line of a cell wafer may be electrically connected to a sub word line driver (SWD) and a bit line sense amplifier (BLSA) of the lower wafer through each Cu-PAD. When a contact defect occurs between a Cu-PAD for connecting a word line to a sub word line driver and a Cu-PAD for connecting a bit line to a sense amplifier due to a hybrid copper bonding (HCB) process defect, the corresponding word line or bit line may be unusable, which may result in a decrease in yield of the memory device.

SUMMARY

Embodiments of the present disclosure may provide memory devices having improved yield.

According to some embodiments of present disclosure, a memory device comprises a cell chip including a memory cell array having a plurality of first lines and a plurality of second lines, first and second bonding pads that are adjacent to one another in a first region, and third and fourth bonding pads that are adjacent to one another in a second region different from the first region; and a logic chip electrically connected to the first, second, third, and fourth bonding pads of the cell chip, wherein the logic chip is configured to write and read data to and from the memory cell array, wherein the first and second bonding pads are electrically connected to a third line among the plurality of first lines, the third bonding pad is electrically connected to a fourth line among the plurality of second lines, and the fourth bonding pad is electrically connected to a fifth line different from the fourth line among the plurality of second lines.

According to some embodiments of present disclosure, a memory device comprises a cell chip including a memory cell array having a plurality of first lines and a plurality of second lines, a first bonding pad set in a first region and electrically connected to a third line among the plurality of first lines, and a second bonding pad set in a second region and electrically connected to a fourth line among the plurality of second lines; and a logic chip configured to write and read data to and from the memory cell array of the cell chip, wherein the first bonding pad set comprises one or more bonding pads, each of which is electrically connected to the third line, the second bonding pad set comprises one or more bonding pads, each of which is electrically connected to the fourth line, and a number of the one or more bonding pads included in the first bonding pad set is greater than a number of the one or more bonding pads included in the second bonding pad set.

According to some embodiments of present disclosure, a memory device comprises a cell chip comprising a memory cell array having a plurality of memory cells at crossing points of a plurality of word lines and a plurality of bit lines, first and second bonding pads that are adjacent to one another in a first region and electrically connected to a first word line among the plurality of word lines, and third and fourth bonding pads that are adjacent to one another in a second region different from the first region and electrically connected to first and second bit lines among the plurality of bit lines, respectively; and a logic chip comprising a sub word line driver configured to supply a voltage to the plurality of word lines and a sense amplifier configured to sense a voltage to the plurality of bit lines, wherein the logic chip is configured to and write and read data to and from the memory cell array, wherein the logic chip further comprises fifth and sixth bonding pads that are adjacent to one another in a third region and electrically connected to the sub word line driver, and seventh and eighth bonding pads that are adjacent to one another in a fourth region different from the third region and electrically connected to the sense amplifier, wherein the cell chip is bonded onto the logic chip such that the first bonding pad is on the fifth bonding pad, the second bonding pad is on the sixth bonding pad, the third bonding pad is on the seventh bonding pad, and the fourth bonding pad is on the eighth bonding pad, and wherein the second bit line is different from the first bit line among the plurality of bit lines.

Embodiments of the present disclosure are not limited to those mentioned above, and additional embodiments of the present disclosure, which may not be explicitly described herein, will be clearly understood by those skilled in the art from the following description of the present disclosure.

DETAILED DESCRIPTION OF EMBODIMENTS

Hereinafter, embodiments according to the technical spirits of the present disclosure will be described with reference to the accompanying drawings. The terms "first," "second," etc., may be used herein merely to distinguish one component, layer, direction, etc. from another. The terms "comprises," "comprising," "includes" and/or "including," when used herein, specify the presence of stated elements, but do not preclude the presence of additional elements. The term "and/or" includes any and all combinations of one or more of the associated listed items. The term "connected" may be used herein to refer to a physical and/or electrical connection. When components or layers are referred to herein as "directly" on, or "in direct contact" or "directly connected," no intervening components or layers are present. Likewise, when components are "immediately" adjacent to one another, no intervening components may be present.

Figure 1:
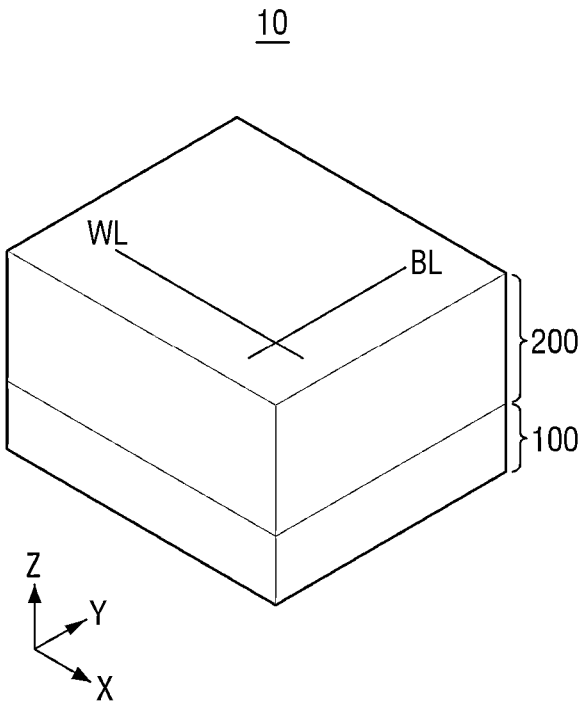
FIGS. 1 and 2 are example views illustrating a memory device according to some embodiments.
Figure 2:
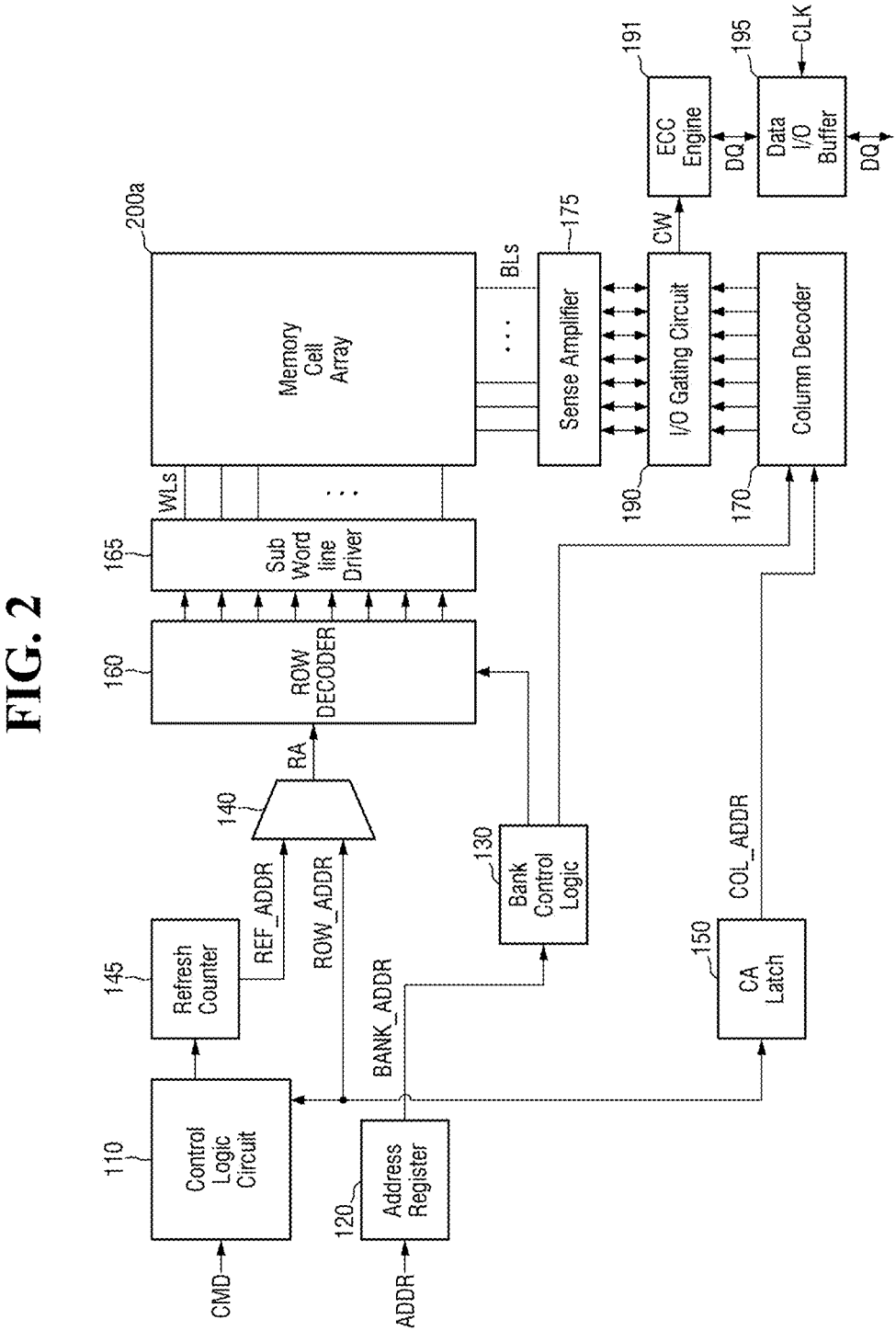

FIGS. 1 and 2 are example views illustrating a memory device according to some embodiments.

Referring to FIGS. 1 and 2, a memory device 10 may include a cell chip 200 and a logic chip 100. The cell chip 200 may include a memory cell array 200*a*. The memory cell array may include a plurality of word lines, a plurality of bit lines, and a plurality of memory cells formed at points where the word lines cross or intersect the bit lines. The memory cell array 200*a* may further include a plurality of spare word lines for repairing a word line in which a defect has occurred among a plurality of word lines, and a plurality of spare bit lines for repairing a bit line in which a defect has occurred among a plurality of bit lines. Each of the plurality of memory cells may have a state corresponding to stored data. The plurality of memory cells may be accessed by the word lines and the bit lines. The plurality of memory cells may be volatile memory cells that lose stored data when supplied power is cut off, or may be nonvolatile memory cells that retain stored data even when supplied power is cut off. For example, when the plurality of memory cells are volatile memory cells, the memory device 10 may be a dynamic random access memory (DRAM), a static random access memory (SRAM), a mobile DRAM, a Double Data Rate Synchronous Dynamic Random Access Memory (DDR SDRAM), a Low Power DDR (LPDDR) SDRAM, a Graphic DDR (GDDR) SDRAM, or a Rambus Dynamic Random Access Memory (RDRAM). In another aspect, when the plurality of memory cells are nonvolatile memory cells, the memory device 10 may be a non-volatile memory such as an electrically erasable programmable read-only memory (EEPROM), a flash memory, a phase change random access memory (PRAM), a resistance random access memory (RRAM), a nano floating gate memory (NFGM), a Polymer Random Access Memory (PoRAM), a Magnetic Random Access Memory (MRAM), or a Ferroelectric Random Access Memory (FRAM). Additionally or alternatively, the memory device 10 may be a hybrid memory device in which a memory cell array includes both a volatile memory cell and a nonvolatile memory cell.

The logic chip 100 may include a control logic circuit 110, an address register 120, a bank control logic circuit 130, a row address multiplexer 140, a refresh counter 145, a column address latch 150, a row decoder 160, a fuse array, a column decoder 170, a sub word line driver 165, a sense amplifier 175, an input/output gating circuit 190, an ECC engine 191, and a data input/output buffer 195.

The control logic circuit 110 may receive a command (CMD) signal from the outside (e.g., from an external device) and control various components in the memory device 100.

The address register 120 may receive an address ADDR from the outside (e.g., from an external device). The address ADDR may include a bank address BANK_ADDR, a row address ROW_ADDR, a column address COL_ADDR, and the like. The address register 120 may provide the bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The bank row decoder 160 may be activated in response to the bank control signal. Also, the column decoder 170 may be activated in response to the bank control signal corresponding to the bank address BANK_ADDR.

The row address multiplexer 140 may receive the row address ROW_ADDR from the address register 120, and may receive a refresh row address REF_ADDR from the refresh counter 145. The row address multiplexer 140 may select one of the row address ROW_ADDR or the refresh row address REF_ADDR and thus output the selected one to a row address RA. The row address RA may be delivered to the row decoder 160.

The refresh counter 145 may sequentially output the refresh row address REF_ADDR in accordance with the control of the control logic circuit 110.

The row decoder 160 activated by the bank control logic circuit 130 may decode the row address RA output from the row address multiplexer 140 to activate the word line corresponding to the row address RA. In detail, the row decoder may transmit an activation signal for the word line corresponding to the row address RA to the sub word line driver 165. The sub word line driver 165 may receive the activation signal for the word line corresponding to the row address RA and apply a word line driving voltage to a corresponding word line or spare word line.

The column address latch 150 may receive the column address COL_ADDR from the address register 120 and temporarily store the received column address COL_ADDR. The column address latch 150 may gradually increase the received column address COL_ADDR in a burst mode. The column address latch 150 may provide the temporarily stored column address COL_ADDR or the gradually increased column address COL_ADDR to the column decoder 170.

The column decoder 170 activated by the bank control logic circuit 130 among the column decoders 170 may activate a sense amplifier 175 corresponding to the bank address BANK_ADDR and the column address COL_ADDR through the corresponding input/output gating circuit 190 to select a column selection line CSL corresponding to the column address COL_ADDR, and may select a corresponding bit line or spare bit line by selecting the column selection line CSL. The input/output gating circuit 190 may include a circuit for gating input/output data, an input data mask logic, read data latches for storing data output from the memory cell array, and write drivers for writing data in the memory cell array.

A codeword CW read from a bank memory array of the memory cell array 200a may be detected by the sense amplifier 175 corresponding to the bank memory array. In addition, the codeword CW may be stored in the read data latch. The codeword CW stored in the read data latch may be ECC-decoded by the ECC engine 191, and data DQ for which ECC-decoding is performed may be provided to the outside (e.g., to an external device) through the data input/output buffer 195.

The data input/output buffer 195 may provide the data DQ to the ECC engine 191 based on a clock signal CLK in a write operation. The data input/output buffer 195 may provide the data DQ provided from the ECC engine 191 to the outside (e.g., to an external device) based on the clock signal CLK in a read operation.

The memory device 10 may have a chip-to-chip (C2C) structure. The C2C structure may mean that a cell chip 200 which is an upper chip including a cell region CELL is manufactured on a first wafer, a logic chip 100 which is a lower chip including a peripheral circuit region PERI is manufactured on a second wafer different from the first wafer, and then the upper chip and the lower chip are connected to each other by a bonding method. For example, the bonding method may refer to a method for electrically connecting a bonding pad formed on the uppermost metal layer of the upper chip with a bonding pad formed on the uppermost metal layer of the lower chip. For example, when the bonding metal is formed of copper (Cu), the bonding method may be a Cu—Cu bonding method. The bonding metal may be formed of aluminum (Al) or tungsten (W).

Figure 3:
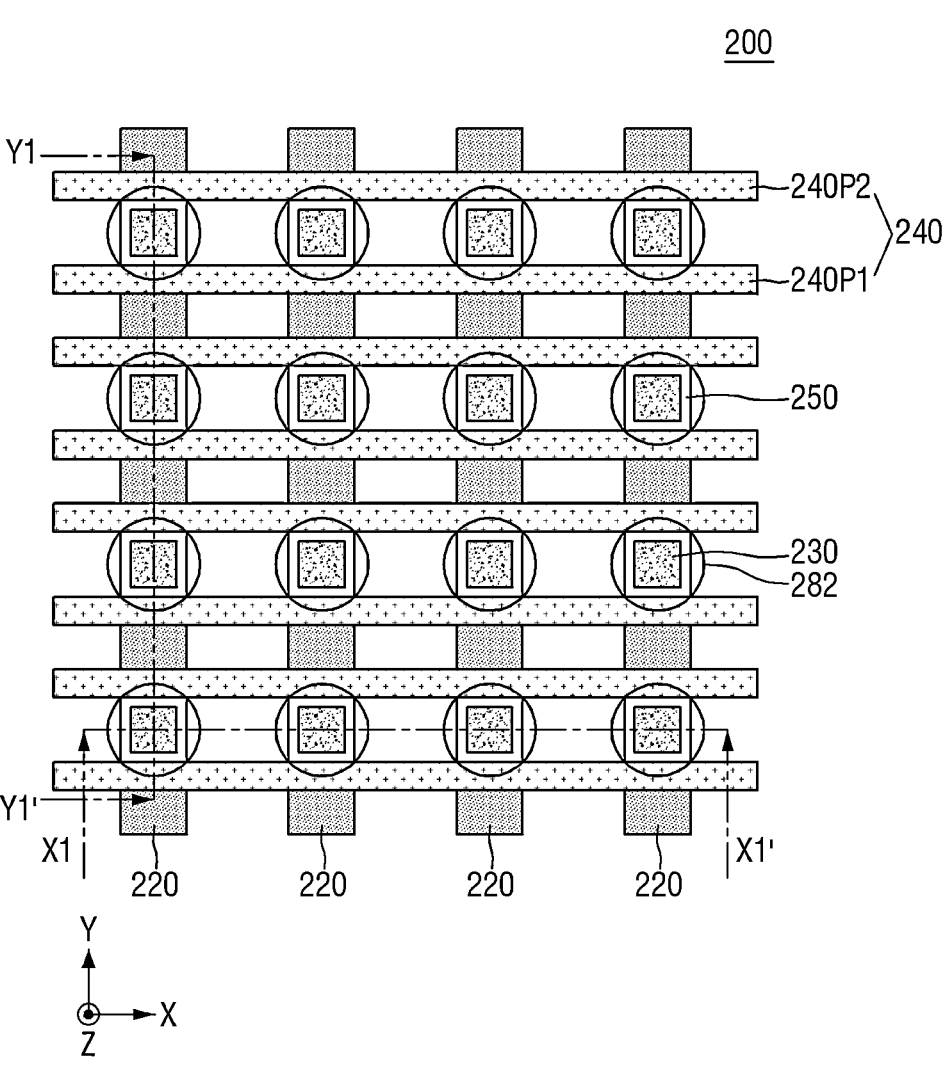
FIG. 3 is an example layout view illustrating a cell chip according to some embodiments.
Figure 4:
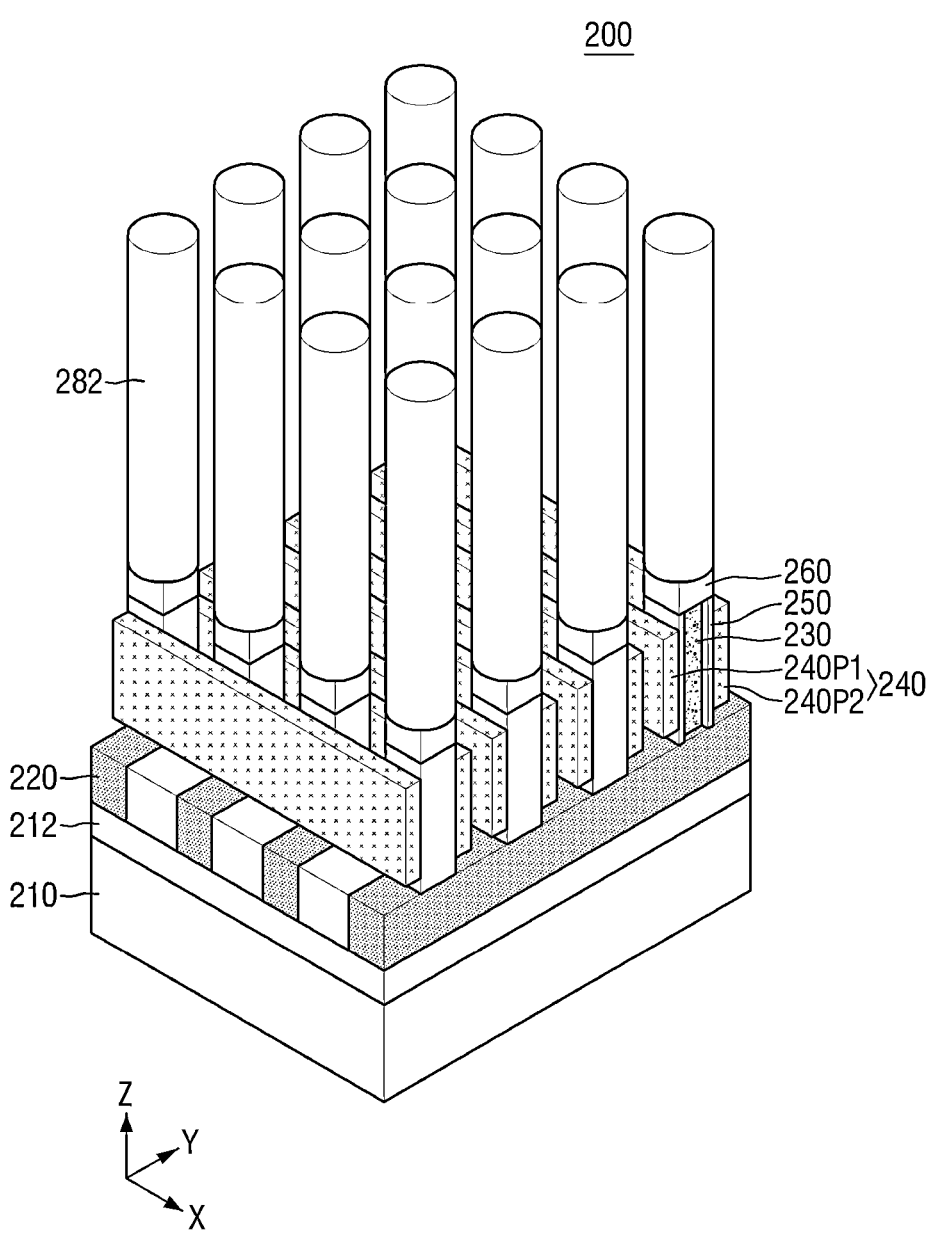
FIG. 4 is an example perspective view illustrating a cell chip according to some embodiments.
Figure 5:
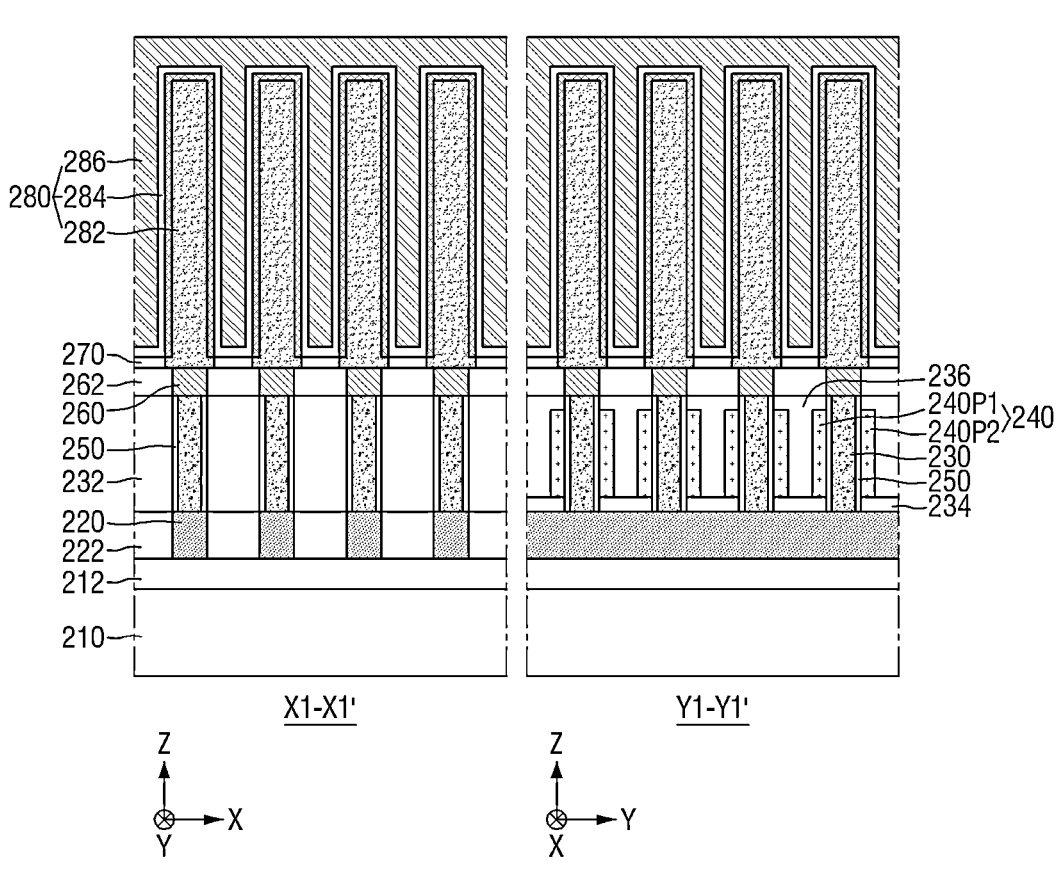
FIG. 5 is a cross-sectional view taken along lines X1-X1' and Y1-Y1' of FIG. 4.

FIG. 3 is a layout view illustrating a cell chip according to some embodiments, FIG. 4 is a perspective view illustrating a cell chip according to some embodiments, and FIG. 5 is a cross-sectional view taken along lines X1-X1' and Y1-Y1' of FIG. 3.

Referring to FIGS. 3 to 5, the cell chip 200 may include a substrate 210, a plurality of source/drain lines 220, a channel layer 230, a gate electrode 240, a gate insulating layer 250, and a capacitor structure 280. The cell chip 200 may include a vertical channel transistor (VCT). The vertical channel transistor may indicate a structure in which a channel length of the channel layer 230 is extended along a vertical direction from the substrate 210.

A lower insulating layer 212 may be disposed on the substrate 210, and the plurality of source/drain lines 220 may be spaced apart from each other on the lower insulating layer 212 in a first direction (direction X), and may extend in a second direction (direction Y). A plurality of first insulating patterns 222 may be disposed on the lower insulating layer 212 to fill a space between the plurality of source/drain lines 220. The plurality of first insulating patterns 222 may extend in the second direction (direction Y), and upper surfaces of the plurality of first insulating patterns 222 may be disposed at the same level (e.g., may be equidistant with respect to a frame of reference, such as the substrate 210) as upper surfaces of the plurality of source/drain lines 220. The plurality of source/drain lines 220 may serve as bit lines of the cell chip 200.

In some embodiments, the plurality of source/drain lines 220 may include doped polysilicon, metal, conductive metal nitride, conductive metal silicide, conductive metal oxide, or their combination. For example, the plurality of source/drain lines 220 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$ or their combination, but are not limited thereto. The plurality of source/drain lines 220 may include a single layer or multi-layer of the aforementioned materials. In an example embodiment, the plurality of source/drain lines 220 may include a two-dimensional semiconductor material, and for example, the two-dimensional semiconductor material may include graphene, carbon nanotube, or their combination.

The channel layer 230 may be arranged in the form of matrixes spaced apart from each other in the first direction (direction X) and the second direction (direction Y) on the plurality of source/drain lines 220. The channel layer 230 may have a first width in the first direction (direction X) and a first height in a third direction (direction Z), wherein the first height may be greater than the first width. For example, the first height may be about 2 times to 10 times of the first width, but is not limited thereto. A bottom portion of the channel layer 230 may serve as a first source/drain region (not shown), an upper portion of the channel layer 230 may serve as a second source/drain region (not shown), and a portion of the channel layer 230 between the first and second source/drain regions may serve as a channel region (not shown). Spatially relative terms such as 'top,' 'above,' 'upper,' 'upper portion,' 'upper surface,' 'bottom,' 'below,' 'lower,' 'lower portion,' 'lower surface,' 'side surface,' and the like may be denoted by reference numerals and refer to the drawings, except where otherwise indicated. It will be understood that such spatially relative terms are intended to encompass different orientations of the device in addition to the orientation depicted in the figures.

In some embodiments, the channel layer 230 may include an oxide semiconductor, and for example, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Z-n$_y$Sn$_z$O, Sn$_x$O, Hf$_x$In$_y$Zn$_z$O, Ga$_x$Zn$_y$Sn$_z$O, Al$_x$Zn$_y$Sn$_z$O, Yb$_x$-Ga$_y$Zn$_z$O, In$_x$Ga$_y$O or their combination. The channel layer 230 may include a single layer or multi-layer of the oxide semiconductor. In some embodiments, the channel layer 230 may have bandgap energy greater than that of silicon. For example, the channel layer 230 may have bandgap energy of about 1.5 eV to 5.6 eV. For example, the channel layer 230 may have optimal channel performance when having bandgap energy of about 2.0 eV to 4.0 eV. For example, the channel layer 230 may be polycrystalline or amorphous, but is not limited thereto. In example embodiments, the channel layer 230 may include a two-dimensional semiconductor material, and for example, the two-dimensional semiconductor material may include a graphene, a carbon nanotube, or their combination.

The gate electrode 240 may serve as the word line of the cell chip 200. The gate electrode 240 may extend in the first direction (direction X) on both (e.g., opposing) sidewalls of the channel layer 230. The gate electrode 240 may include a first sub-gate electrode 240P1 facing a first sidewall of the channel layer 230 and a second sub-gate electrode 240P2 facing a second sidewall opposite to the first sidewall of the channel layer 230. As one channel layer 230 is disposed between the first sub-gate electrode 240P1 and the second sub-gate electrode 240P2, the cell chip 200 may have a dual gate transistor structure, but embodiments of the present disclosure are not limited thereto. For example, the second sub-gate electrode 240P2 may be omitted, and only the first sub-gate electrode 240P1 facing the first sidewall of the channel layer 230 may be formed so that a single gate transistor structure may be implemented.

The gate electrode 240 may include doped polysilicon, a metal, a conductive metal nitride, a conductive metal silicide, a conductive metal oxide or their combination. For example, the gate electrode 240 may include doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$ or their combination, but is not limited thereto.

The gate insulating layer 250 may surround the sidewalls of the channel layer 230, and may be interposed between the channel layer 230 and the gate electrode 240. The term "surrounding" or "covering" or "filling" as may be used herein may not require completely surrounding or covering or filling the described elements or layers, but may, for example, refer to partially surrounding or covering or filling the described elements or layers, for example, with voids or other spaces throughout. For example, as shown in FIG. 3, the entire sidewalls of the channel layer 230 may be sur-rounded by the gate insulating layer 250, and a portion of the sidewalls of the gate electrode 240 may be in contact with the gate insulating layer 250. In other embodiments, the gate insulating layer 250 may extend in an extending direction (i.e., the first direction (direction X)) of the gate electrode 240, and only two of the sidewalls of the channel layer 230 facing the gate electrode 240 may be in contact with the gate insulating layer 250.

In some embodiments, the gate insulating layer 250 may be made of a silicon oxide film, a silicon oxynitride film, a high dielectric film having a dielectric constant higher than that of the silicon oxide film, or their combination. The high dielectric film may be made of a metal oxide or a metal oxynitride. For example, the high dielectric film capable of being used as the gate insulating layer 250 may be made of HfO$_2$, HfSiO, HfSiON, HfTaO, HfTiO, HfZrO, ZrO$_2$, Al$_2$O$_3$, or their combination, but is not limited thereto.

A plurality of second insulating patterns 232 may extend in the second direction (direction Y) on the plurality of first insulating patterns 222, and the channel layer 230 may be disposed between two adjacent second insulating patterns 232 among the plurality of second insulating patterns 232. In addition, between two adjacent second insulating patterns 232, a first buried layer 234 and a second buried layer 236 may be disposed in a space between two adjacent channel layers 230. The first buried layer 234 may be disposed at a bottom portion of the space between two adjacent channel layers 230, and the second buried layer 236 may be formed on the first buried layer 234 to fill the remainder of the space between two adjacent channel layers 230. An upper surface of the second buried layer 236 may be disposed at the same level as an upper surface of the channel layer 230, and the second buried layer 236 may cover an upper surface of the gate electrode 240. In other embodiments, the plurality of second insulating patterns 232 may be formed of material layers continuous with the plurality of first insulating pat-terns 222, or the second buried layer 236 may be formed of a material layer continuous with the first buried layer 234.

A capacitor contact 260 may be disposed on the channel layer 230. The capacitor contact 260 may be disposed to vertically overlap the channel layer 230, and may be arranged in the form of matrixes spaced apart from each other in the first direction (direction X) and the second direction (direction Y). The capacitor contact 260 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or their combina-tion, but is not limited thereto. The upper insulating layer 262 may surround sidewalls of the capacitor contact 260 on the plurality of second insulating patterns 232 and the second buried layer 236.

An etching stop film 270 may be disposed on the upper insulating layer 262, and the capacitor structure 280 may be disposed on the etching stop film 270. The capacitor struc-ture 280 may include a lower electrode 282, a capacitor dielectric layer 284, and an upper electrode 286.

The lower electrode 282 may be electrically connected to an upper surface of the capacitor contact 260 by passing through the etching stop film 270. The lower electrode 282 may be formed in a pillar type or pillar shape that extends in the third direction (direction Z), but is not limited thereto. In example embodiments, the lower electrode 282 may be disposed to vertically overlap the capacitor contact 260, and may be arranged in the form of matrixes spaced apart from each other in the first direction (direction X) and the second direction (direction Y). In other embodiments, a landing pad (not shown) may be further disposed between the capacitor contact 260 and the lower electrode 282, so that the lower electrode 282 may be arranged in a hexagonal shape.

Figure 6:
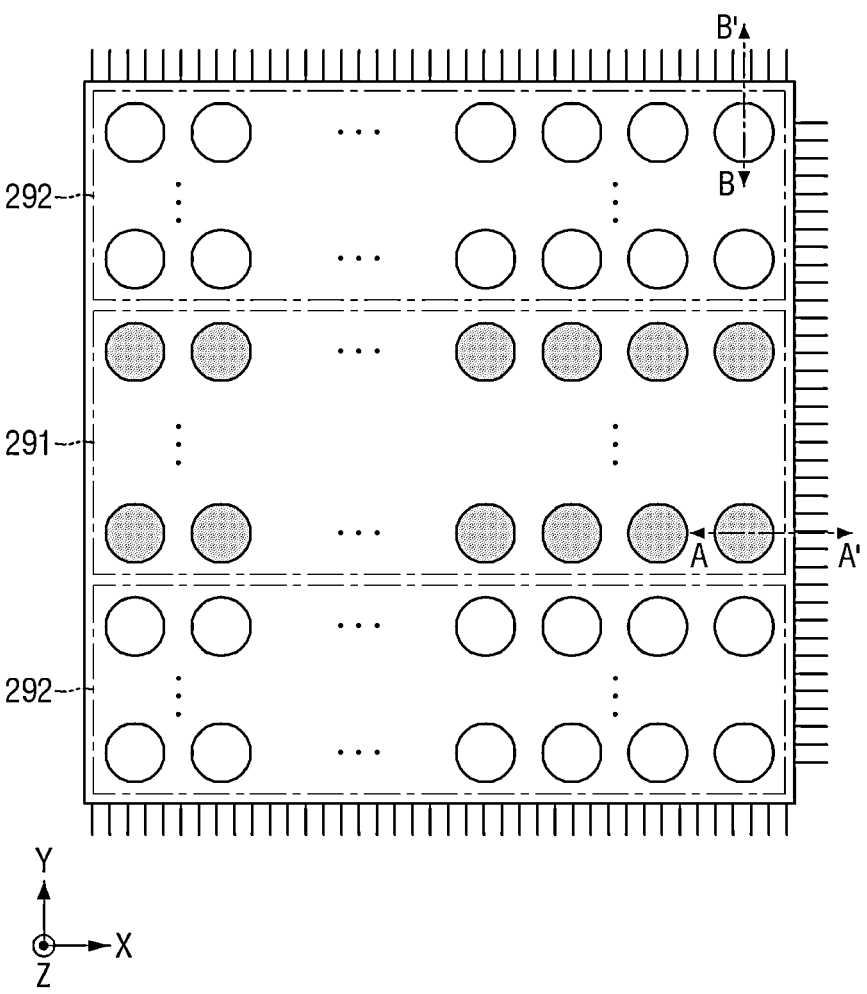
FIG. 6 is an example view illustrating arrangement of bonding pads according to some embodiments.

FIG. 6 is an example view illustrating arrangement of bonding pads according to some embodiments.

Referring to FIG. 6, a plurality of bonding pads may be arranged in a first region 291 and a second region 292. The plurality of bonding pads may be disposed to be spaced apart from each other. The bonding pads disposed in the first region 291 may be electrically connected to the plurality of word lines of the cell chip 200 to correspond to the plurality of word lines, respectively. The bonding pads disposed in the second region 292 may be electrically connected to the plurality of bit lines of the cell chip 200 to correspond to the plurality of bit lines, respectively.

Figure 7:
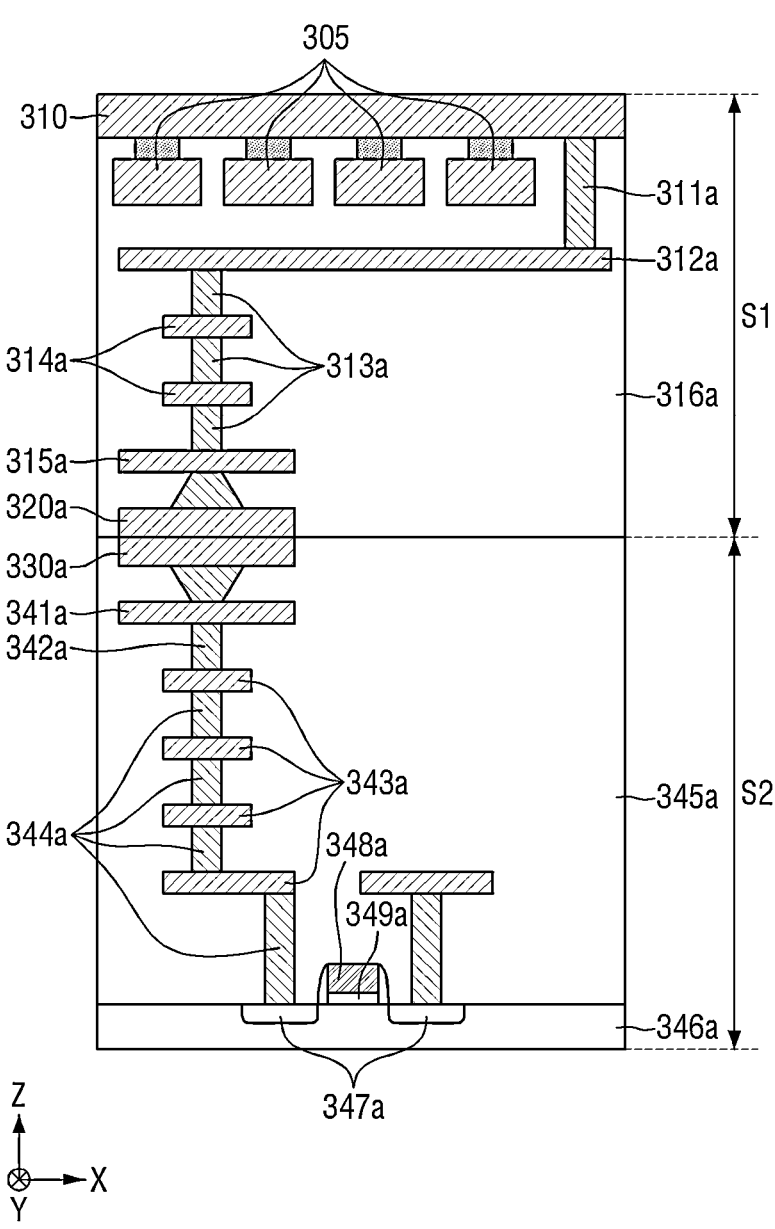
FIG. 7 is a cross-sectional view taken along line A-A' of FIG. 6.

FIG. 7 is a cross-sectional view taken along line A-A' of FIG. 6.

Referring to FIG. 7, the cell chip 200 may include a first semiconductor structure S1, and the logic chip 100 may include a second semiconductor structure S2. The first semiconductor structure S1 may include a word line 310, circuit contact plugs 311a and 313a, circuit wiring lines 312a, 314a and 315a, an insulating layer 316a, and an upper bonding pad 320a. The second semiconductor structure S2 may include a substrate 346a, a source/drain region 347a, a gate electrode 348a, a gate insulating layer 349a, a lower bonding pad 330a, circuit contact plugs 342a and 344a, circuit wiring lines 341a and 343a, and an insulating layer 345a. The circuit contact plugs 311a, 313a, 342a, and 344a and the circuit wiring lines 312a, 314a, 315a, 341a and 343a of the first semiconductor structure S1 and the second semiconductor structure S2 are not limited to the form shown in FIG. 7, and fewer or more circuit contact plugs 311a, 313a, 342a and 344a and circuit wiring lines 312a, 314a, 315a, 341a and 343a than those shown in FIG. 7 may be formed in the first semiconductor structure S1 and the second semiconductor structure S2.

The word line 310 of the first semiconductor structure S1 may be electrically connected to the upper bonding pad 320a through the circuit contact plugs 311a and 313a and the circuit wiring lines 312a, 314a and 315a. The insulating layer 316a is disposed inside the cell chip 200 to cover the word line 310, the circuit contact plugs 311a and 313a, the circuit wiring lines 312a, 314a and 315a and the upper bonding pad 320a, and may include an insulating material such as silicon oxide and silicon nitride.

The lower bonding pad 330a may be electrically con-nected to the sub word line driver 165 of the logic chip 100 through the circuit contact plugs 342a and 344a and the circuit wiring lines 341a and 343a. The source/drain region 347a, the gate electrode 348a and the gate insulating layer 349a, which are shown, may be portions of the sub word line driver 165 of the logic chip 100. The insulating layer 345*a* may be disposed inside the logic chip 100 to cover the circuit contact plugs 342*a* and 344*a*, the circuit wiring lines 341*a* and 343*a* and the lower bonding pad 330*a*, and may include an insulating material such as silicon oxide and silicon nitride.

The cell chip 200 including the first semiconductor structure S1 and the logic chip 100 including the second semiconductor structure S2 may be bonded to each other by hybrid bonding including copper (Cu)-copper (Cu) bonding along an interface between the upper bonding pad 320*a* and the lower bonding pad 330*a* and dielectric-dielectric bonding along an interface between the insulating layers 316*a* and 345*a*, also referred to herein as respective bonding interfaces. The upper bonding pad 320*a* of the first semiconductor structure S1 may be electrically connected to the lower bonding pad 330*a* of the second semiconductor structure S2 by bonding, and as a result, the word line 310 of the first semiconductor structure S1 and the sub word line driver 165 of the logic chip 100 may be electrically connected to each other. The lower bonding pad 330*a* and the upper bonding pad 320*a* may be formed of, for example, aluminum, copper, or tungsten.

Figure 8:
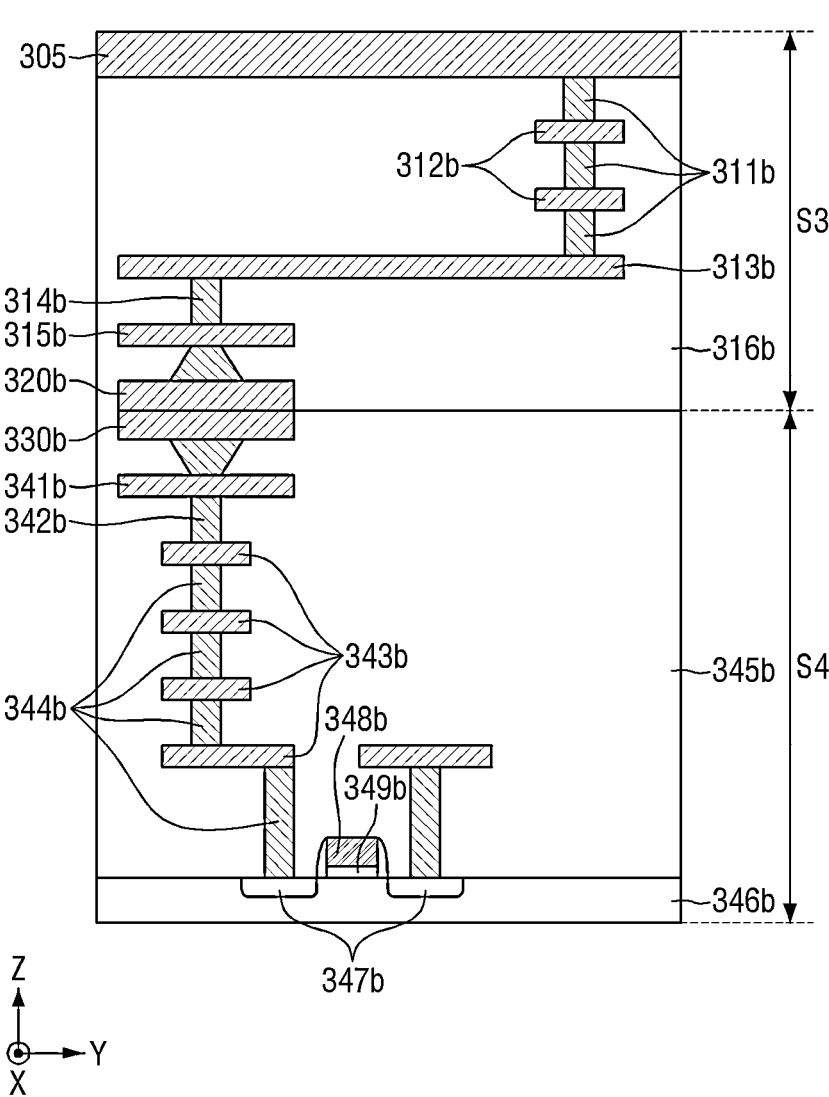
FIG. 8 is a cross-sectional view taken along line B-B' of FIG. 6.

FIG. 8 is a cross-sectional view taken along line B-B' of FIG. 6.

Referring to FIG. 8, the cell chip 200 may include a third semiconductor structure S3, and the logic chip 100 may include a fourth semiconductor structure S4. The third semiconductor structure S3 may include a bit line 305, circuit contact plugs 311*b* and 314*b*, circuit wiring lines 312*b*, 313*b* and 315*b*, an insulating layer 316*b*, and an upper bonding pad 320*b*. The second semiconductor structure S2 may include a substrate 346*b*, a source/drain region 347*b*, a gate electrode 348*b*, a gate insulating layer 349*b*, a lower bonding pad 330*b*, circuit contact plugs 342*b* and 344*b*, circuit wiring lines 341*b* and 343*b*, and an insulating layer 345*b*. The circuit contact plugs 311*b*, 314*b*, 342*b* and 344*b* and the circuit wiring lines 312*b*, 313*b*, 315*b*, 341*b* and 343*b* of the third semiconductor structure S3 and the fourth semiconductor structure S4 are not limited to the form shown in FIG. 8, and fewer or more circuit contact plugs 311*b*, 314*b*, 342*b*, and 344*b* and circuit wiring lines 312*b*, 313*b*, 315*b*, 341*b* and 343*b* than those shown in FIG. 8 may be formed in the third semiconductor structure S3 and the fourth semiconductor structure S4.

The bit line 305 of the third semiconductor structure S3 may be electrically connected to the upper bonding pad 320*b* through the circuit contact plugs 311*b* and 314*b* and the circuit wiring lines 312*b*, 313*b* and 315*b*. The insulating layer 316*b* may be disposed inside the cell chip 200 to cover the bit line 305, the circuit contact plugs 311*b* and 314*b*, the circuit wiring lines 312*b*, 313*b* and 315*b* and the upper bonding pad 320*b*, and may include an insulating material such as silicon oxide and silicon nitride.

The lower bonding pad 330*b* may be electrically connected to the sense amplifier 175 of the logic chip 100 through the circuit contact plugs 342*b* and 344*b* and the circuit wiring lines 341*b* and 343*b*. The source/drain region 347*b*, the gate electrode 348*b* and the gate insulating layer 349*b*, which are shown, may be portions of the sense amplifier 175 of the logic chip 100. The insulating layer 345*b* may be disposed inside the logic chip 100 to cover the circuit contact plugs 342*b* and 344*b*, the circuit wiring lines 341*b* and 343*b* and the lower bonding pad 330*b*, and may include an insulating material such as silicon oxide and silicon nitride.

The cell chip 200 including the third semiconductor structure S3 and the logic chip 100 including the fourth semiconductor structure S4 may be bonded to each other by hybrid bonding including copper (Cu)-copper (Cu) bonding along an interface between the upper bonding pad 320*b* and the lower bonding pad 330*b* and dielectric-dielectric bonding along an interface between the insulating layers 316*b* and 345*b*. The upper bonding pad 320*b* of the third semiconductor structure S3 may be electrically connected to the lower bonding pad 330*b* of the fourth semiconductor structure S4 by bonding, and as a result, the bit line 305 of the third semiconductor structure S3 and the sense amplifier 175 of the logic chip 100 may be electrically connected to each other. The lower bonding pad 330*b* and the upper bonding pad 320*b* may be formed of, for example, aluminum, copper, or tungsten.

Figure 9:
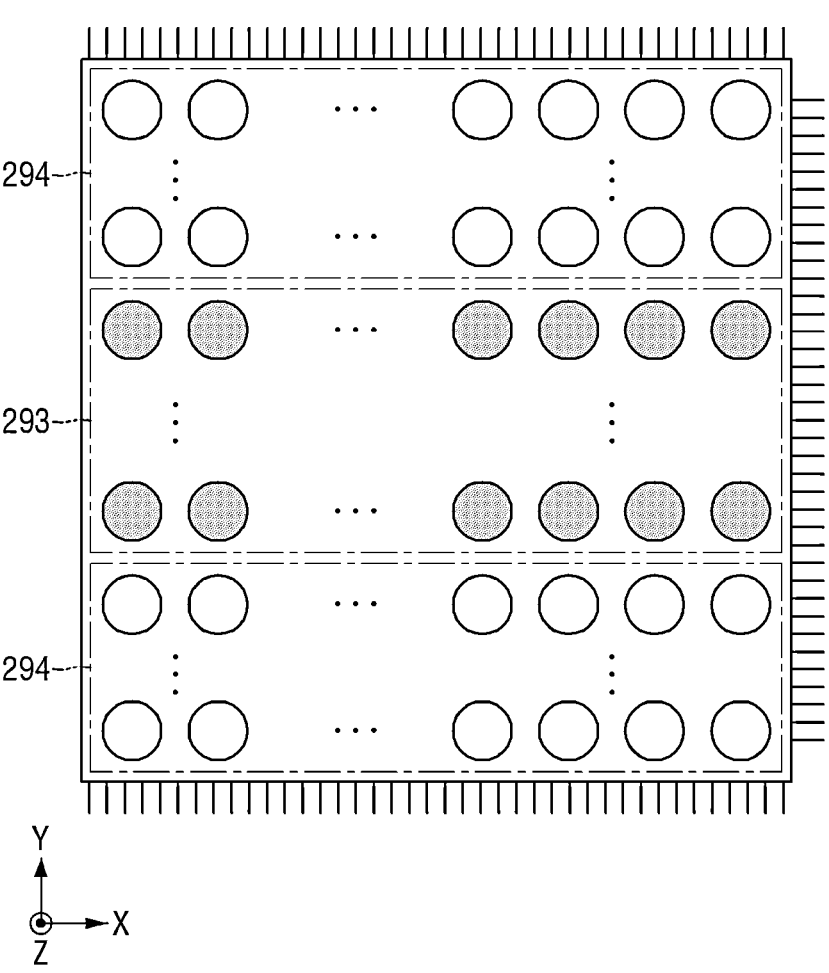
FIG. 9 is an example view illustrating arrangement of bonding pads according to some embodiments.

FIG. 9 is an example view illustrating arrangement of bonding pads according to some embodiments.

Referring to FIG. 9, a plurality of bonding pads may be arranged in a third region 293 and a fourth region 294. The plurality of bonding pads may be disposed to be spaced apart from each other. The bonding pads disposed in the third region 293 may be electrically connected to the sub word line driver 165 of the logic chip 100. The bonding pads disposed in the fourth region 294 may be electrically connected to the sense amplifier 175 of the logic chip 100. As the cell chip 200 and the logic chip 100 are connected to each other by a bonding method, the bonding pads disposed in the third region 293 may be disposed to be in contact with the bonding pads disposed in the first region 291 shown in FIG. 6. Also, the bonding pads disposed in the fourth region 294 may be disposed to be in contact with the bonding pads disposed in the second region 292 shown in FIG. 6. As the cell chip 200 and the logic chip 100 are connected to each other by a bonding method, the third region 293 may overlap the first region 291 in the third direction Z, e.g., in plan view. Also, the fourth region 294 may overlap the second region 292 in the third direction Z. Components or layers described with reference to "overlap" in a particular direction may be at least partially obstructed by one another when viewed along a line extending in the particular direction or in a plane perpendicular to the particular direction.

Figure 10:
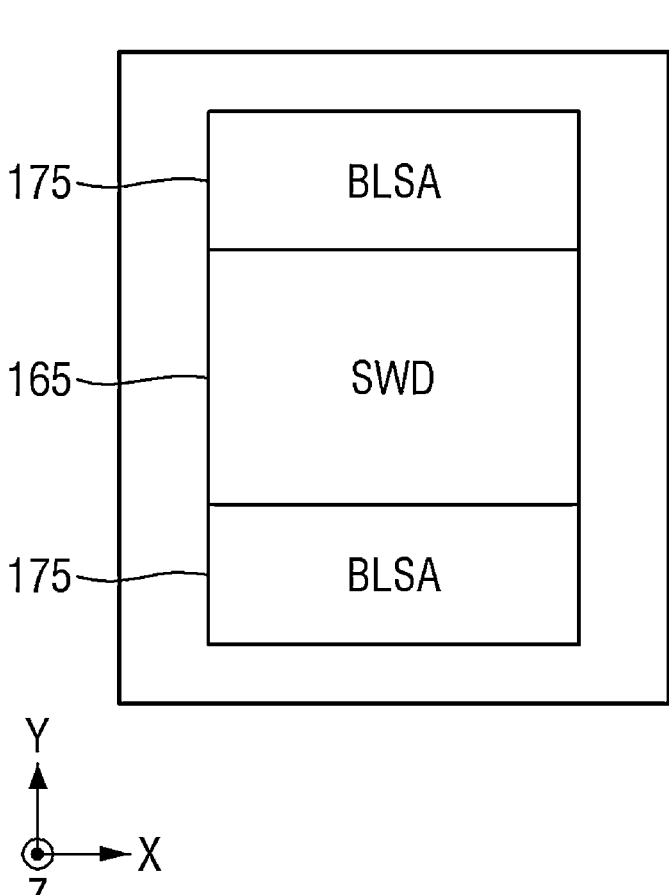
FIG. 10 is an example view illustrating arrangement of a sub word line driver and a sense amplifier on a logic chip according to some embodiments.

FIG. 10 is an example view illustrating arrangement of a sub word line driver and a sense amplifier on a logic chip according to some embodiments.

Referring to FIG. 10, the sub word line driver 165 and the sense amplifier 175 are shown on the logic chip 100. Although not shown, the control logic circuit 110, the address register 120, the bank control logic circuit 130, the row address multiplexer 140, the refresh counter 145, the column address latch 150, the row decoder 160, the column decoder 170, the input/output gating circuit 190, the ECC engine 191 and the data input/output buffer 195 may be further disposed on the logic chip 100.

The plurality of bonding pads disposed in the third region 293 shown in FIG. 9 may be electrically connected to the sub word line driver 165. The third region 293 may be disposed to be spaced apart from the sub word line driver 165 in the third direction Z passing through the upper surface of the logic chip 100. In other words, the third region 293 may overlap the sub word line driver 165 in the third direction Z, e.g., in plan view. As described above, since the third region 293 may overlap the first region 291 shown in FIG. 6 in the third direction Z, the sub word line driver 165 may overlap the first region 291 in the third direction Z, e.g., in plan view.

The plurality of bonding pads disposed in the fourth region 294 shown in FIG. 9 may be electrically connected to the sense amplifier 175. The fourth region 294 may be disposed to be spaced apart from the sense amplifier 175 in the third direction Z passing through the upper surface of the logic chip 100. In other words, the fourth region 294 may overlap the sense amplifier 175 in the third direction Z. As described above, since the fourth region 294 may overlap the second region 292 shown in FIG. 6 in the third direction Z, the sense amplifier 175 may overlap the second region 292 in the third direction Z.

Figure 11:
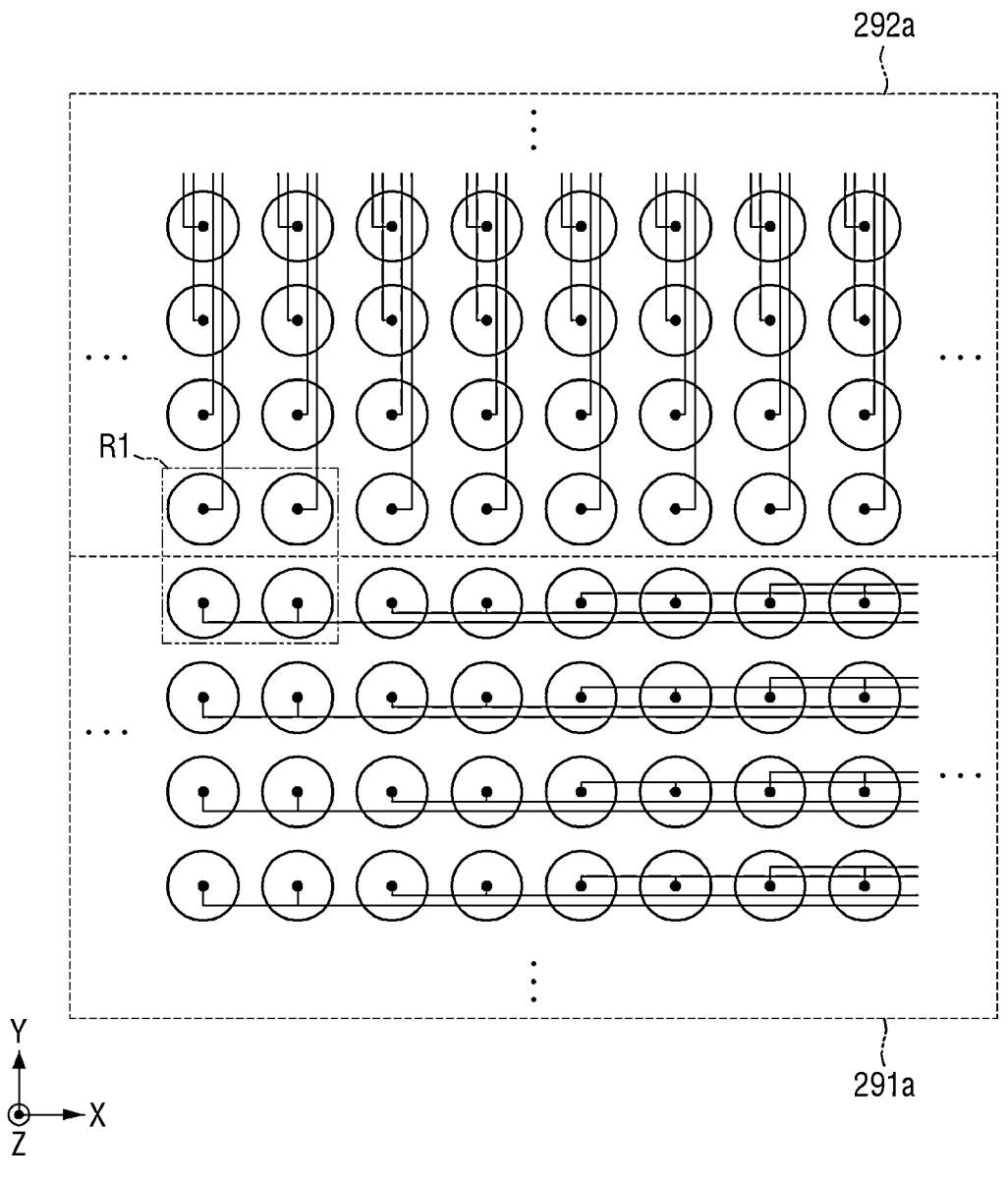
FIG. 11 is an example view illustrating arrangement of bonding pads according to some embodiments.

FIG. 11 is an example view illustrating arrangement of bonding pads according to some embodiments.

Referring to FIG. 11, a plurality of bonding pads are arranged in a first region 291a and a second region 292a. The plurality of bonding pads may be disposed to be spaced apart from each other. The bonding pads disposed in the first region 291a may be electrically connected to a plurality of word lines of the cell chip 200 to correspond to the plurality of word lines, respectively. The bonding pads disposed in the second region 292a may be electrically connected to a plurality of bit lines of the cell chip 200 to correspond to the plurality of bit lines, respectively. Unlike FIG. 6, two of the plurality of bonding pads disposed in the first region 291a may be connected to one word line. In detail, two bonding pads connected to one word line may be adjacent to each other and connected to one word line in parallel. That is, multiple of the bonding pads disposed in the first region 291a may be connected to the same word line (i.e., multiple bonding pads per word line). The plurality of bonding pads disposed in the second region 292a may be connected to one bit line, respectively. That is, each of the bonding pads disposed in the second region 292a may be connected to a respective bit line (i.e., one bonding pad per bit line).

In FIG. 11, two of the plurality of bonding pads disposed in the first region 291a are connected to one word line, and each of the bonding pads disposed in the second region 292a are connected to a respective bit line, but the present disclosure is not limited thereto. For example, 'm' number of bonding pads (where 'm' is a natural number of 2 or more) of the plurality of bonding pads disposed in the first region 291a may be connected to one word line, and 'n' number of bonding pads (where 'n' is a natural number less than 'm') of the plurality of bonding pads disposed in the second region 292a may be connected to one bit line. That is, in embodiments of the present disclosure, the number of bonding pads provided per word line is greater than the number of bonding pads provided per bit line.

Figure 12:
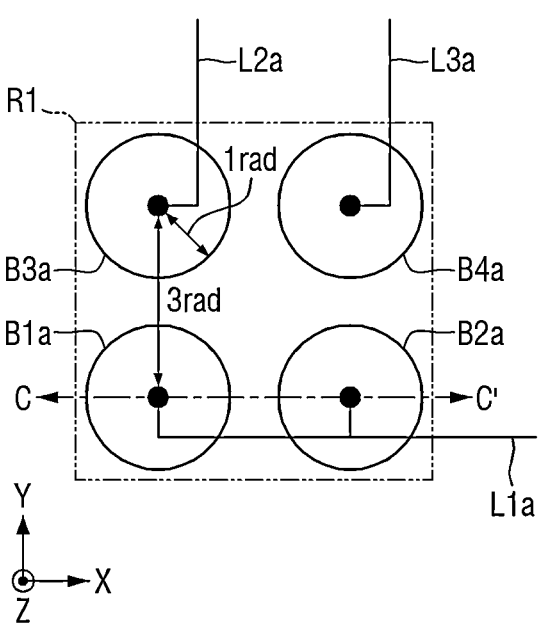
FIG. 12 is an enlarged view illustrating a region R1 of FIG. 11.

FIG. 12 is an enlarged view illustrating a region R1 of FIG. 11.

Referring to FIG. 12, four bonding pads are shown. In detail, the bonding pads may have a circular shape having an arbitrary radius of 1 rad, and the radii may be all the same. The four bonding pads may have a distance of 3 rad from a center point of a bonding pad to a center point of another nearby bonding pad, that is, a distance of three times of the radius of the bonding pads. For example, when a side toward which the first direction (+X) is directed is a right side, a direction (−X) opposite to the first direction is a left side, a side toward which the second direction (+Y) is directed is an upper end, and a side toward which a direction (−Y) opposite to the second direction is a lower end, a distance between center points of an upper left bonding pad B3a and a lower left bonding pad B1a may be 3 rad. Likewise, a distance between center points of the upper left bonding pad B3a and an upper right bonding pad B4a may be 3 rad. However, the distances between the center points are not limited to the above examples, and may be set differently.

The upper left bonding pad B3a and the upper right bonding pad B4a may be disposed in the second region 292a. The lower left bonding pad B1a and a lower right bonding pad B2a may be disposed in the first region 291a. The lower left and right bonding pads B1a and B2a may be connected to one word line L1a of the plurality of word lines in parallel. The upper left bonding pad B3a may be connected to one bit line L2a of the plurality of bit lines, and the upper right bonding pad B4a may be connected to one bit line L3a of a plurality of bit lines, which is different from the bit line L2a connected to the upper left bonding pad B3a among the plurality of bit lines.

Figure 13:
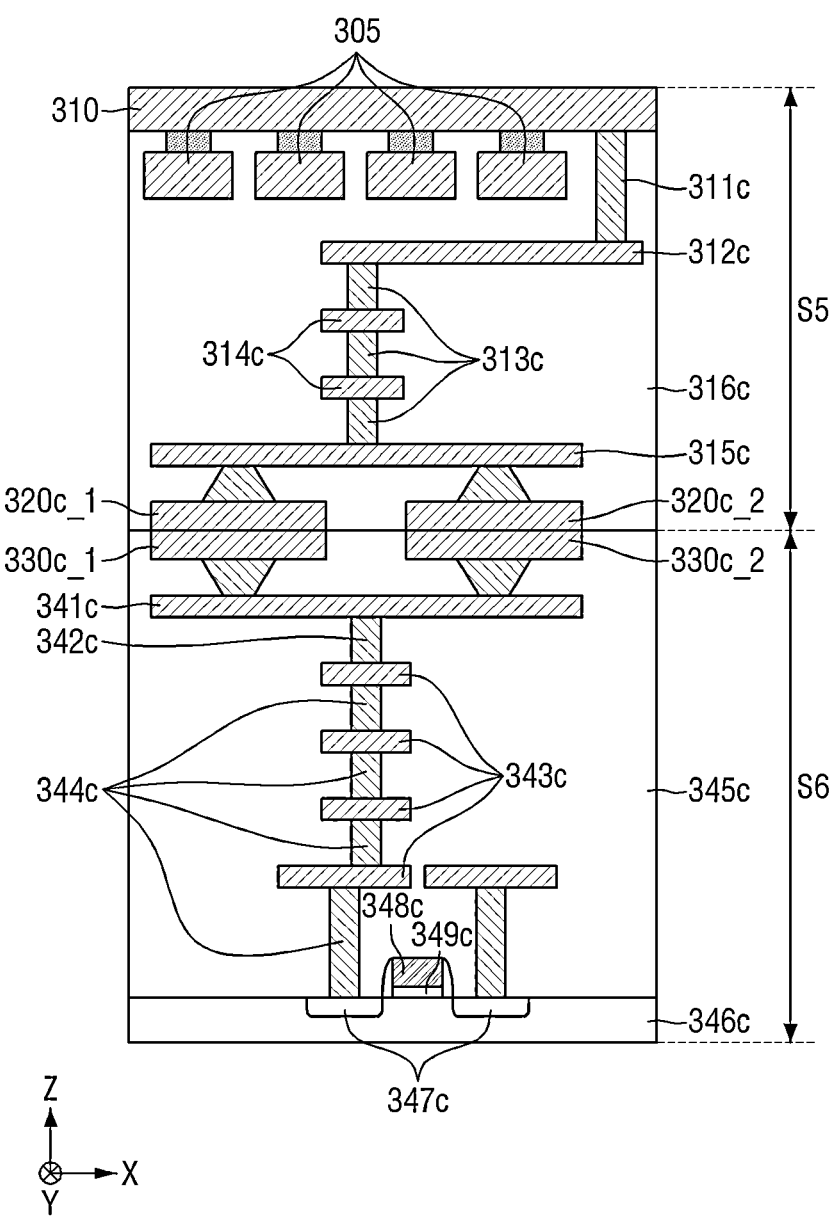
FIG. 13 is a cross-sectional view taken along line C-C' of FIG. 12.

FIG. 13 is a cross-sectional view taken along line C-C' of FIG. 12.

Referring to FIG. 13, the cell chip 200 may include a fifth semiconductor structure S5, and the logic chip 100 may include a sixth semiconductor structure S6. When the first direction +X is referred to as a right side and the opposite direction −X of the first direction is referred to as a left side, the fifth semiconductor structure S5 may include a word line 310, circuit contact plugs 311c and 313c, circuit wiring lines 312c, 314c and 315c, an insulating layer 316c, an upper left bonding pad 320c_1, and an upper right bonding pad 320c_2. The sixth semiconductor structure S6 may include a substrate 346c, a source/drain region 347c, a gate electrode 348c, a gate insulating layer 349c, a lower left bonding pad 330c_1, a lower right bonding pad 330c_2, circuit contact plugs 342c and 344c, circuit wiring lines 341c and 343c, and an insulating layer 345c. The circuit contact plugs 311c, 313c, 342c and 344c and the circuit wiring lines 312c, 314c, 315c, 341c and 343c of the fifth semiconductor structure S5 and the sixth semiconductor structure S6 are not limited to the form shown in FIG. 13, and fewer or more circuit contact plugs 311c, 313c, 342c and 344c and circuit wiring lines 312c, 314c, 315c, 341c and 343c than those shown in FIG. 13 may be formed in the fifth semiconductor structure S5 and the sixth semiconductor structure S6.

The upper left bonding pad 320c_1 and the upper right bonding pad 320c_2 may be connected to the circuit wiring line 315c in parallel. Therefore, the word line 310 of the fifth semiconductor structure S5 may be electrically connected to the upper left bonding pad 320c_1 and the upper right bonding pad 320c_2 through the circuit contact plugs 311c and 313c and the circuit wiring lines 312c, 314c and 315c. The insulating layer 316c is disposed inside the cell chip 200 to cover the word line 310, the circuit contact plugs 311c and 313c and the circuit wiring lines 312c, 314c and 315c, the upper left bonding pad 320c_1 and the upper right bonding pad 320c_2, and may include an insulating material such as silicon oxide and silicon nitride.

The lower left bonding pad 330c_1 and the lower right bonding pad 330c_2 may be connected to the circuit wiring line 341c in parallel, and may be electrically connected to the sub word line driver 165 of the logic chip 100 through the circuit contact plugs 342c and 344c and the circuit wiring lines 341c and 343c. The source/drain region 347c, the gate electrode 348c and the gate insulating layer 349c, which are shown, may be portions of the sub word line driver 165 of the logic chip 100. The insulating layer 345c is disposed inside the logic chip 100 to cover the circuit contact plugs 342c and 344c, the circuit wiring lines 341c and 343c and the lower left and right bonding pads 330c_1 and 330c_2, and may include an insulating material such as silicon oxide and silicon nitride.

The cell chip 200 including the fifth semiconductor structure S5 and the logic chip 100 including the sixth semiconductor structure S6 may be bonded to each other by hybrid bonding including copper (Cu)-copper (Cu) bonding along an interface between the upper left bonding pad 320c_1 and the lower left bonding pad 330c_1, copper (Cu)-copper (Cu) bonding along an interface between the upper right bonding pad 320c_2 and the lower right bonding pad 330c_2 and dielectric-dielectric bonding along an interface between the insulating layers 316c and 345c. The upper left and right bonding pads 320c_1 and 320c_2 of the fifth semiconductor structure S5 may be electrically connected to the lower left and right bonding pads 330c_1 and 330c_2 of the sixth semiconductor structure S6 by bonding, and as a result, the word line 310 of the fifth semiconductor structure S5 and the sub word line driver 165 of the logic chip 100 may be electrically connected to each other. The lower left and right bonding pads 330c_1 and 330c_2 and the upper and right bonding pads 320c_1 and 320c_2 may be formed of, for example, aluminum, copper, or tungsten.

The size of a memory device chip may be reduced with each successive generation. As the size of the chip is reduced, an area of the bonding pad that may electrically connect the chips to each other may be also reduced. As the area of the pad is reduced, a bonding defect may occur in the process of bonding the upper wafer corresponding to the cell chip 200 to the lower wafer corresponding to the logic chip 100. For example, misalignment in which the bonding pad of the upper wafer and the bonding pad of the lower wafer are misaligned or voids may occur in the bonding process. In case of the memory device 10, when misalignment or voids occur in the bonding process, the plurality of word lines and the plurality of bit lines of the cell chip 200 may not be electrically connected to the sub word line driver 165 and the sense amplifier 175 of the logic chip 100. In this case, among the plurality of word lines and bit lines, word lines or bit lines, which are not electrically connected due to a defect in the bonding process, may be repaired through a spare word line or a spare bit line. A normal memory cell in which a defect occurs may be replaced with a redundant memory cell through the spare word line and the spare bit line.

When one word line is repaired, about 8500 memory cells may be generally replaced with redundant memory cells. When one bit line is repaired, about 2600 memory cells may be generally replaced with redundant memory cells. In other words, when a defective word line is repaired, more repair resources may be required (e.g., as much as three to four times more) as compared to the case where a defective bit line is repaired. That is, when a word line is defective, yield of the memory device may be further reduced as compared with the case where a bit line is defective.

To prevent the yield of the memory device 10 from being reduced due to a contact defect between bonding pads, a plurality of bonding pads (e.g., two or more bonding pads) may be connected to one word line or one bit line in parallel. When a contact defect occurs in one of the plurality of bonding pads, which are connected to one word line or one bit line in parallel, due to a process defect, the one word line or the one bit line may be electrically connected to the logic chip 100 by another bonding pad that does not cause a contact defect.

The method of connecting multiple bonding pads to one word line or one bit line in parallel may suppress the decrease in the yield of the memory device 10 due to a contact defect between the bonding pads, but the area occupied by the bonding pads may be increased and consequently the size of the chip may be increased.

According to some embodiments disclosed in the present disclosure, more bonding pads may be connected to one of the plurality of word lines than bonding pads connected to one of the plurality of bit lines. That is, the number of bonding pads connected per word line may be greater than the number of bonding pads connected per bit line. Therefore, the size of the chip may be less increased and the yield of the memory device may be more efficiently improved than the case that both the bonding pads connected to one of the plurality of word lines and the bonding pads connected to one of the plurality of bit lines are increased.

Figure 14:
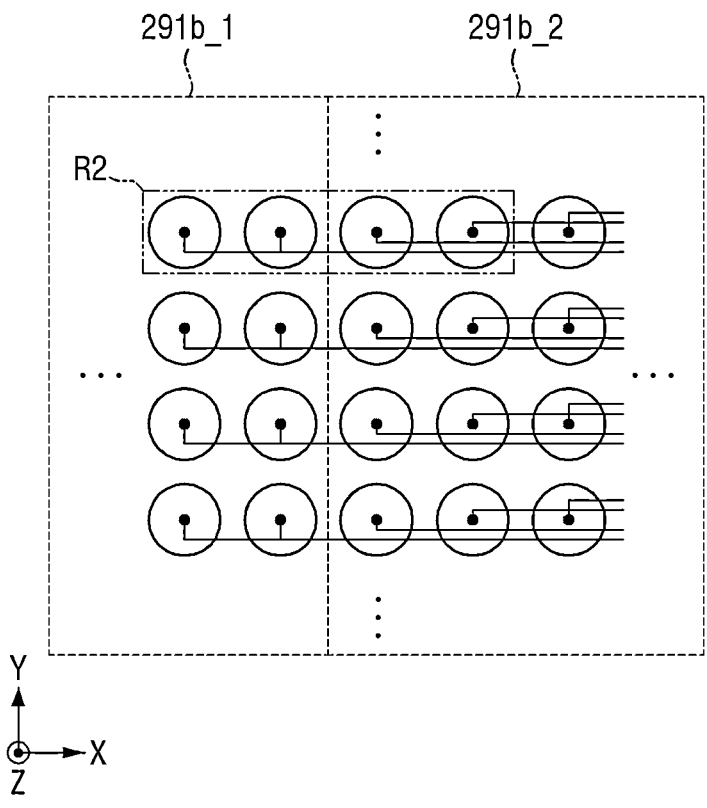
FIG. 14 is an example view illustrating arrangement of bonding pads according to some embodiments.

FIG. 14 is an example view illustrating arrangement of bonding pads according to some embodiments.

Referring to FIG. 14, the first region 291 may include a first normal region 291b_2 and a first spare region 291b_1. A plurality of bonding pads are arranged in the first normal region 291b_2 and the first spare region 291b_1. The plurality of bonding pads may be disposed to be spaced apart from each other. The bonding pads disposed in the first spare region 291b_1 may be electrically connected to a plurality of spare word lines of the cell chip 200 to correspond to the plurality of spare word lines, respectively. The bonding pads disposed in the first normal region 291b_2 may be electrically connected to a plurality of word lines of the cell chip 200 to correspond to the plurality of word lines, respectively. Two (or more) of the plurality of bonding pads disposed in the first spare region 291b_1 may be connected to one spare word line. In detail, two bonding pads connected to one spare word line may be adjacent to each other and connected to one spare word line in parallel. Each of the plurality of bonding pads disposed in the first normal region 291b_2 may be connected to a respective word line.

In FIG. 14, two of the plurality of bonding pads disposed in the first spare region 291b_1 are connected to one spare word line, and the plurality of bonding pads disposed in the first normal region 291b_2 are respectively connected to one word line, but the present disclosure is not limited thereto. For example, 'k' number of bonding pads (where 'k' is a natural number of 2 or more) among the plurality of bonding pads disposed in the first spare region 291b_1 may be connected to one spare word line, and 'l' (where 'l' is a natural number less than 'k') number of bonding pads among the plurality of bonding pads disposed in the first normal region 291b_2 may be connected to one word line. That is, the number of bonding pads connected per spare word line in the spare region may be greater than the number of bonding pads connected per normal word line in the normal region.

Figure 15:
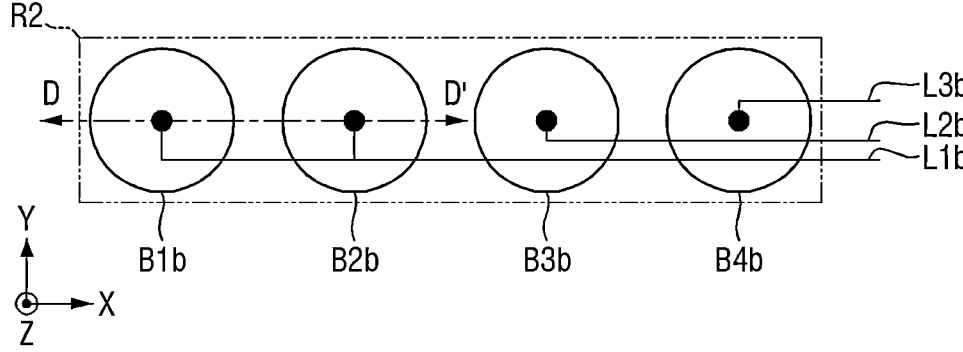
FIG. 15 is an enlarged view illustrating a region R2 of FIG. 14.

FIG. 15 is an enlarged view illustrating a region R2 of FIG. 14.

Referring to FIG. 15, four bonding pads are shown. Since the shape of the bonding pads has been described above, its detailed description will be omitted. The cross section taken along line D-D' has been described above with reference to FIG. 13, and thus its detailed description will be omitted.

A first bonding pad B1b and a second bonding pad B2b may be disposed in the first spare region 291b_1. A third bonding pad B3b and a fourth bonding pad B4b may be disposed in the first normal region 291b_2. The first and second bonding pads B1b and B2b may be connected to one spare word line L1b of a plurality of spare word lines in parallel. The third bonding pad B3b may be connected to one normal word line L2b of a plurality of word lines, and the fourth bonding pad B4b may be connected to one normal word line L3b of a plurality of word lines, which is different from the line connected to the third bonding pad B3b among the plurality of word lines.

A defect may occur even in a spare word line for repairing a defective word line due to a contact defect between the pads, which is generated during a bonding process. When a defect occurs in the spare word line, the defective word line should be repaired with another spare line, rather than with the defective spare word line.

Generating repair resources against defects may occupy greater space and increase the chip size. Therefore, it may be desirable to generate repair resources capable of maximizing the effect of increasing the yield in consideration of process capability. Since the repair resources are limited, when a defective spare word line is to be repaired with another spare word line, in some instances the defective spare word line may not be repaired e.g., due to insufficient repair resources. This may reduce the yield of the memory device.

According to some embodiments disclosed in the present disclosure, more bonding pads may be connected to one of the plurality of spare word lines than bonding pads connected to one of the plurality of (normal) word lines. That is, the number of bonding pads connected per spare word line may be greater than the number of bonding pads connected per normal word line. In general, the number of spare word lines may be less than the number of normal word lines. For example, there may be two spare word lines per 64 normal word lines. That is, increasing the number of bonding pads connected to each spare word line may reduce the chip size more than increasing the number of bonding pads connected to each normal word line. Therefore, arranging the number of bonding pads connected to one of the plurality of spare word lines more than the number of bonding pads connected to one of the plurality of word lines may effectively improve the yield of the memory device.

Figure 16:
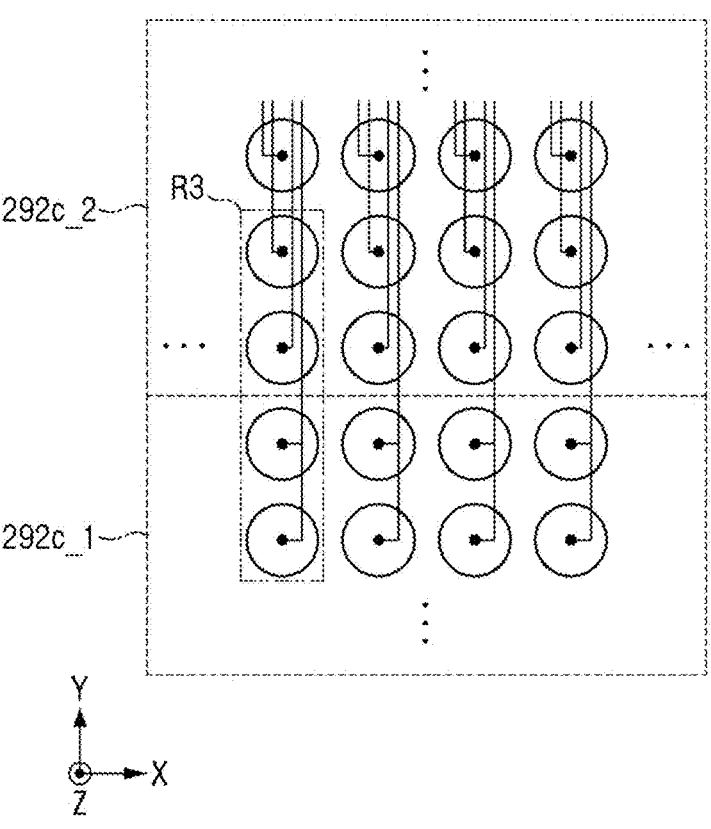
FIG. 16 is an example view illustrating arrangement of bonding pads according to some embodiments.

FIG. 16 is an example view illustrating arrangement of bonding pads according to some embodiments.

Referring to FIG. 16, the second region 292 may include a second normal region 292$c$_2 and a second spare region 292$c$_1. A plurality of bonding pads are arranged in the second normal region 292$c$_2 and the second spare region 292$c$_1. The plurality of bonding pads may be disposed to be spaced apart from each other. The bonding pads disposed in the second spare region 292$c$_1 may be electrically connected to a plurality of spare bit lines of the cell chip 200 to correspond to the plurality of spare bit lines, respectively. The bonding pads disposed in the second normal region 292$c$_2 may be electrically connected to a plurality of bit lines of the cell chip 200 to correspond to the plurality of bit lines, respectively. Two (or more) of the plurality of bonding pads disposed in the second spare region 292$c$_1 may be connected to one spare bit line. In detail, two bonding pads connected to one spare bit line may be adjacent to each other and connected to one spare bit line in parallel. Each of the plurality of bonding pads disposed in the second normal region 292$c$_2 may be connected to a respective bit line.

In FIG. 16, two of the plurality of bonding pads disposed in the second spare region 292$c$_1 are connected to one spare bit line, and the plurality of bonding pads disposed in the second normal region 292$c$_2 are connected to one bit line, respectively, but the present disclosure is not limited thereto. For example, 'k' number of bonding pads (where 'k' is a natural number of 2 or more) among the plurality of bonding pads disposed in the second spare region 292$c$_1 may be connected to one spare bit line, and 'l' (where 'l' is a natural number less than 'k') number of bonding pads among the plurality of bonding pads disposed in the second normal region 292$c$_2 may be connected to one bit line. That is, the number of bonding pads connected per spare bit line in the spare region may be greater than the number of bonding pads connected per normal bit line in the normal region.

Figure 17:
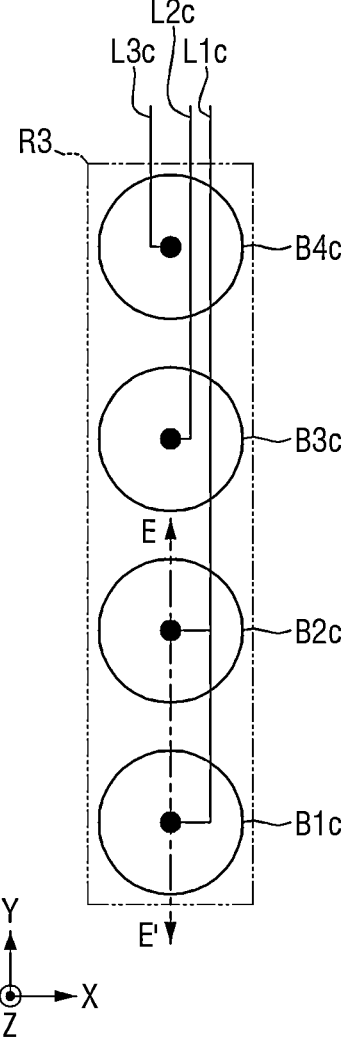
FIG. 17 is an enlarged view illustrating a region R3 of FIG. 16.

FIG. 17 is an enlarged view illustrating a region R3 of FIG. 16.

Referring to FIG. 17, four bonding pads are shown. A first bonding pad B1$c$ and a second bonding pad B2$c$ may be disposed in the second spare region 292$c$_1. A third bonding pad B3$c$ and a fourth bonding pad B4$c$ may be disposed in the second normal region 292$c$_2. The first and second bonding pads B1$c$ and B2$c$ may be connected to one spare bit line L1$c$ of a plurality of spare bit lines in parallel. The third bonding pad B3$c$ may be connected to one normal bit line L2$c$ of a plurality of bit lines, and the fourth bonding pad B4$c$ may be connected to one normal bit line L3$c$ of a plurality of bit lines, which is different from the line L2$c$ connected to the third bonding pad B3$c$ among the plurality of bit lines.

Figure 18:
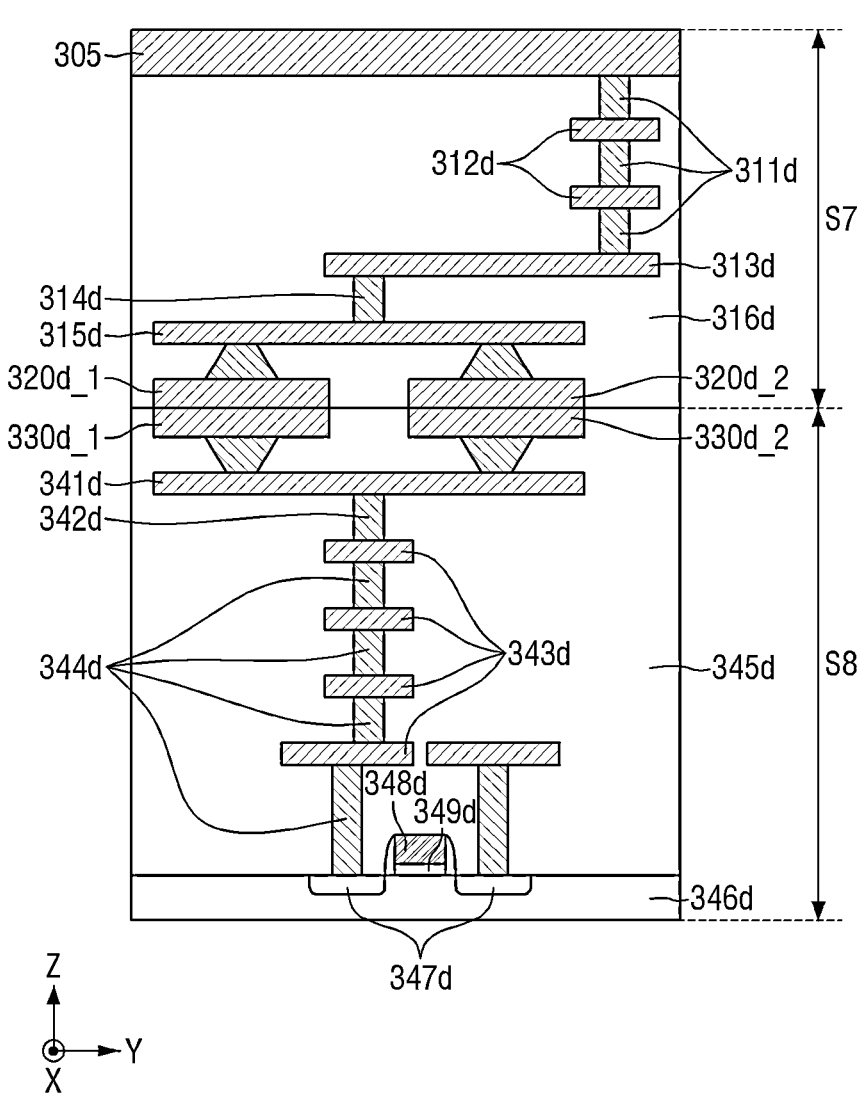
FIG. 18 is a cross-sectional view taken along line E-E' of FIG. 17.

FIG. 18 is a cross-sectional view taken along line E-E' of FIG. 17.

Referring to FIG. 18, the cell chip 200 may include a seventh semiconductor structure S7, and the logic chip 100 may include an eighth semiconductor structure S8. When the first direction +X is referred to as a right side, and the opposite direction −X of the first direction is referred to as a left side, the seventh semiconductor structure S7 may include a bit line 305, circuit contact plugs 311$d$ and 314$d$, circuit wiring lines 312$d$, 313$d$ and 315$d$, an insulating layer 316$d$, an upper left bonding pad 320$d$_1, and an upper right bonding pad 320$d$_2. The eighth semiconductor structure S8 may include a substrate 346$d$, a source/drain region 347$d$, a gate electrode 348$d$, a gate insulating layer 349$d$, a lower left bonding pad 330$d$_1, a lower right bonding pad 330$d$_2, circuit contact plugs 342$d$ and 344$d$, circuit wiring lines 341$d$ and 343$d$, and an insulating layer 345$d$. The circuit contact plugs 311$d$, 314$d$, 342$d$ and 344$d$ and the circuit wiring lines 312$d$, 313$d$, 315$d$, 341$d$ and 343$d$ of the seventh semiconductor structure S7 and the eighth semiconductor structure S8 are not limited to the form shown in FIG. 18, and fewer or more circuit contact plugs 311$d$, 314$d$, 342$d$ and 344$d$ and circuit wiring lines 312$d$, 313$d$, 315$d$, 341$d$ and 343$d$ than those shown in FIG. 18 may be formed in the seventh semiconductor structure S7 and the eighth semiconductor structure S8.

The upper left bonding pad 320$d$_1 and the upper right bonding pad 320$d$_2 may be connected to the circuit wiring line 315$d$ in parallel. Therefore, the bit line 305 of the seventh semiconductor structure S7 may be electrically connected to the upper left bonding pad 320$d$_1 and the upper right bonding pad 320$d$_2 through the circuit contact plugs 311$d$ and 314$d$ and the circuit wiring lines 312$d$, 313$d$ and 315$d$. The insulating layer 316$d$ is disposed inside the cell chip 200 to cover the bit line 305, the circuit contact plugs 311$d$ and 314$d$ and the circuit wiring lines 312$d$, 313$d$ and 315$d$, the upper left bonding pad 320$d$_1 and the upper right bonding pad 320$d$_2, and may include an insulating material such as silicon oxide and silicon nitride.

The lower left bonding pad 330$d$_1 and the lower right bonding pad 330$d$_2 may be connected to the circuit wiring line 341$d$ in parallel, and may be electrically connected to the sense amplifier 175 of the logic chip 100 through the circuit contact plugs 342$d$ and 344$d$ and the circuit wiring lines 341$d$ and 343$d$. The source/drain region 347$d$, the gate electrode 348$d$ and the gate insulating layer 349$d$, which are shown, may be portions of the sense amplifier 175 of the logic chip 100. The insulating layer 345$d$ is disposed inside the logic chip 100 to cover the circuit contact plugs 342$d$ and 344$d$, the circuit wiring lines 341$d$ and 343$d$ and the lower left and right bonding pads 330*d*_1 and 330*d*_2, and may include an insulating material such as silicon oxide and silicon nitride.

The cell chip 200 including the seventh semiconductor structure S7 and the logic chip 100 including the eighth semiconductor structure S8 may be bonded to each other by hybrid bonding including copper (Cu)-copper (Cu) bonding along an interface between the upper left bonding pad 320*d*_1 and the lower left bonding pad 330*d*_1, copper (Cu)-copper (Cu) bonding along an interface between the upper right bonding pad 320*d*_2 and the lower right bonding pad 330*d*_2 and dielectric-dielectric bonding along an interface between the insulating layers 316*d* and 345*d*. The upper left and right bonding pads 320*d*_1 and 320*d*_2 of the seventh semiconductor structure S7 may be electrically connected to the lower left and right bonding pads 330*d*_1 and 330*d*_2 of the eighth semiconductor structure S8 by bonding, and as a result, the bit line 305 of the seventh semiconductor structure S7 and the sense amplifier 175 of the logic chip 100 may be electrically connected to each other. The lower left and right bonding pads 330*d*_1 and 330*d*_2 and the upper left and right bonding pads 320*d*_1 and 320*d*_2 may be formed of, for example, aluminum, copper, or tungsten.

As described above, arranging more bonding pads connected to one of the plurality of spare bit lines than bonding pads connected to one of the plurality of (normal) bit lines may effectively improve the yield of the memory device.

Although embodiments of the present disclosure have been described with reference to the accompanying drawings, embodiments of the present disclosure are not limited to the above embodiments, but may be implemented in various different forms. A person skilled in the art may appreciate that the present disclosure may be practiced in other concrete forms without changing the scope of the present disclosure. Therefore, it should be appreciated that the embodiments as described above is not restrictive but illustrative in all respects.

What is claimed is:

1. A memory device comprising:
a cell chip comprising a memory cell array having a plurality of first lines and a plurality of second lines, first and second bonding pads that are adjacent to one another in a first region, and third and fourth bonding pads that are adjacent to one another in a second region different from the first region; and
a logic chip electrically connected to the first, second, third, and fourth bonding pads of the cell chip, wherein the logic chip is configured to write and read data to and from the memory cell array,
wherein the first and second bonding pads are electrically connected to a third line among the plurality of first lines,
the third bonding pad is electrically connected to a fourth line among the plurality of second lines, and
the fourth bonding pad is electrically connected to a fifth line different from the fourth line among the plurality of second lines.

2. The memory device of claim 1, wherein the cell chip further comprises a first substrate, a plurality of gate electrodes, a plurality of source/drain lines, a plurality of channel layers, and a plurality of capacitor structures,
the source/drain lines are on the first substrate, are spaced apart from each other in a first direction, and extend in a second direction that intersects the first direction, the channel layers are on the source/drain lines and are spaced apart from each other in the first direction and in the second direction in a matrix arrangement,
the gate electrodes extend in the first direction on opposing sidewalls of the channel layers, and
the capacitor structures are electrically connected to the channel layers and extend in a third direction that intersects the first direction and the second direction.

3. The memory device of claim 1, wherein the logic chip comprises a sub word line driver configured to supply a voltage to connected lines and a sense amplifier configured to sense a voltage to connected lines, and
the first and second bonding pads are electrically connected to the sub word line driver, and the third and fourth bonding pads are electrically connected to the sense amplifier.

4. The memory device of claim 3, wherein the cell chip is bonded to the logic chip along a bonding interface therebetween, wherein the bonding interface comprises a hybrid bond,
the logic chip further comprises fifth and sixth bonding pads in a third region and electrically connected to the sub word line driver, and seventh and eighth bonding pads in a fourth region and electrically connected to the sense amplifier,
the fifth bonding pad is in contact with and is electrically connected to the first bonding pad,
the sixth bonding pad is in contact with and is electrically connected to the second bonding pad,
the seventh bonding pad is in contact with and is electrically connected to the third bonding pad, and
the eighth bonding pad is in contact with and is electrically connected to the fourth bonding pad.

5. The memory device of claim 4, wherein the sub word line driver overlaps the first region and the third region in a vertical direction that is perpendicular to an upper surface of the logic chip, and
the sense amplifier overlaps the second region and the fourth region in the vertical direction.

6. The memory device of claim 1, wherein the logic chip comprises a sub word line driver configured to supply a voltage to connected lines,
the plurality of first lines are configured to repair defective lines among the plurality of second lines, and
the first, second, third, and fourth bonding pads are electrically connected to the sub word line driver.

7. The memory device of claim 6, wherein the cell chip is bonded to the logic chip along a bonding interface therebetween, wherein the bonding interface comprises a hybrid bond,
the logic chip further comprises fifth and sixth bonding pads in a third region and electrically connected to the sub word line driver, and seventh and eighth bonding pads in a fourth region and electrically connected to the sub word line driver,
the fifth bonding pad is in contact with and is electrically connected to the first bonding pad,
the sixth bonding pad is in contact with and is electrically connected to the second bonding pad,
the seventh bonding pad is in contact with and is electrically connected to the third bonding pad, and
the eighth bonding pad is in contact with and is electrically connected to the fourth bonding pad.

8. The memory device of claim 7, wherein the sub word line driver overlaps the first, second, third, and fourth regions in a vertical direction that is perpendicular to an upper surface of the logic chip.

9. The memory device of claim 1, wherein the logic chip comprises a sense amplifier configured to sense a voltage to connected lines, the plurality of first lines are configured to repair defective lines among the plurality of second lines, and the first, second, third, and fourth bonding pads are electrically connected to the sense amplifier.

10. The memory device of claim 9, wherein the cell chip is bonded to the logic chip along a bonding interface therebetween, wherein the bonding interface comprises a hybrid bond, the logic chip further comprises fifth and sixth bonding pads disposed in a third region and electrically connected to the sense amplifier, and seventh and eighth bonding pads disposed in a fourth region and electrically connected to the sense amplifier, the fifth bonding pad is in contact with and is electrically connected to the first bonding pad, the sixth bonding pad is in contact with and is electrically connected to the second bonding pad, the seventh bonding pad is in contact with and is electrically connected to the third bonding pad, and the eighth bonding pad is in contact with and is electrically connected to the fourth bonding pad.

11. The memory device of claim 10, wherein the sense amplifier overlaps the first, second, third, and fourth regions in a vertical direction that is perpendicular to an upper surface of the logic chip.

12. A memory device comprising:

a cell chip comprising a memory cell array having a plurality of first lines and a plurality of second lines, a first bonding pad set in a first region and electrically connected to a third line among the plurality of first lines, and a second bonding pad set in a second region and electrically connected to a fourth line among the plurality of second lines; and a logic chip configured to write and read data to and from the memory cell array of the cell chip, wherein the first bonding pad set comprises one or more bonding pads, each of which is electrically connected to the third line, the second bonding pad set comprises one or more bonding pads, each of which is electrically connected to the fourth line, and a number of the one or more bonding pads included in the first bonding pad set is greater than a number of the one or more bonding pads included in the second bonding pad set.

13. The memory device of claim 12, wherein the cell chip further comprises a plurality of bonding pad sets in the first region and the second region, and the first bonding pad set, the second bonding pad set, and the plurality of bonding pad sets are connected to different lines among the plurality of first lines and the plurality of second lines.

14. The memory device of claim 12, wherein the cell chip further comprises a first substrate, a plurality of gate electrodes, a plurality of source/drain lines, a plurality of channel layers, and a plurality of capacitor structures, the source/drain lines are on the first substrate, are spaced apart from each other in a first direction, and extend in a second direction that intersects the first direction, the channel layers are on the plurality of source/drain lines and are spaced apart from each other in the first direction and in the second direction in a matrix arrangement, the gate electrodes extend in the first direction on opposing sidewalls of the channel layers, and the capacitor structures are electrically connected to the channel layers and extend in a third direction that intersects the first direction and the second direction.

15. The memory device of claim 12, wherein the logic chip comprises a sub word line driver configured to supply a voltage to a plurality of word lines and a sense amplifier configured to sense a voltage to a plurality of bit lines, the first bonding pad set is electrically connected to the sub word line driver, and the second bonding pad set is electrically connected to the sense amplifier.

16. The memory device of claim 12, wherein the logic chip comprises a sub word line driver configured to supply a voltage to connected lines, the plurality of first lines are configured to repair defective lines among the plurality of second lines, and the first and second bonding pad sets are electrically connected to the sub word line driver.

17. The memory device of claim 12, wherein the logic chip comprises a sense amplifier configured to sense a voltage to connected lines, the plurality of first lines are configured to repair defective lines among the plurality of second lines, and the first and second bonding pad sets are electrically connected to the sense amplifier.

18. A memory device comprising:

a cell chip comprising a memory cell array having a plurality of memory cells at crossing points of a plurality of word lines and a plurality of bit lines, first and second bonding pads that are adjacent to one another in a first region and electrically connected to a first word line among the plurality of word lines, and third and fourth bonding pads that are adjacent to one another in a second region different from the first region and electrically connected to first and second bit lines among the plurality of bit lines, respectively; and a logic chip comprising a sub word line driver configured to supply a voltage to the plurality of word lines and a sense amplifier configured to sense a voltage to the plurality of bit lines, wherein the logic chip is configured to and write and read data to and from the memory cell array, wherein the logic chip further comprises fifth and sixth bonding pads that are adjacent to one another in a third region and electrically connected to the sub word line driver, and seventh and eighth bonding pads that are adjacent to one another in a fourth region different from the third region and electrically connected to the sense amplifier, wherein the cell chip is bonded onto the logic chip such that the first bonding pad is on the fifth bonding pad, the second bonding pad is on the sixth bonding pad, the third bonding pad is on the seventh bonding pad, and the fourth bonding pad is on the eighth bonding pad, and wherein the second bit line is different from the first bit line among the plurality of bit lines.

19. The memory device of claim 18, wherein the cell chip further comprises a first substrate, a plurality of gate electrodes, a plurality of channel layers, and a plurality of capacitor structures, the bit lines are on the first substrate, are spaced apart from each other in a first direction, and extend in a second direction that intersects the first direction, the channel layers are on the plurality of bit lines, and are spaced apart from each other in the first direction and in the second direction in a matrix arrangement,

the gate electrodes extend in the first direction on oppos-
ing sidewalls of the plurality of channel layers, and
the capacitor structures are electrically connected to the
channel layers and extend in a third direction that
intersects the first direction and the second direction.

20. The memory device of claim 18, wherein the sub word
line driver overlaps the first region and the third region in a
vertical direction that is perpendicular to an upper surface of
the logic chip, and
the sense amplifier overlaps the second region and the
fourth region in the vertical direction.

* * * * *

22